(12) United States Patent
Kamiya

(10) Patent No.: US 11,647,266 B2
(45) Date of Patent: May 9, 2023

(54) ELECTRONIC APPARATUS CAPABLE OF REDUCING ELECTROMAGNETIC FIELD NOISE

(71) Applicant: CANON KABUSHIKI KAISHA, Tokyo (JP)

(72) Inventor: Jun Kamiya, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 258 days.

(21) Appl. No.: 16/953,760

(22) Filed: Nov. 20, 2020

(65) Prior Publication Data

US 2021/0160403 A1    May 27, 2021

(30) Foreign Application Priority Data

Nov. 27, 2019 (JP) ............................. JP2019-214014

(51) Int. Cl.

| H04N 5/232 | (2006.01) |
|---|---|
| H04N 23/51 | (2023.01) |
| H05K 1/18 | (2006.01) |
| H05K 9/00 | (2006.01) |
| H05K 1/02 | (2006.01) |
| H04N 23/54 | (2023.01) |
| H04N 23/68 | (2023.01) |

(52) U.S. Cl.
CPC ............. H04N 23/51 (2023.01); H04N 23/54 (2023.01); H04N 23/682 (2023.01); H05K 1/028 (2013.01); H05K 1/189 (2013.01); H05K 9/0083 (2013.01)

(58) Field of Classification Search
CPC ............... H01Q 17/004; H05N 5/2257; H04N 5/23264; H04N 5/2252; H04N 5/2253; H05K 1/028; H05K 1/189; H05K 9/0083
See application file for complete search history.

(56) References Cited

U.S. PATENT DOCUMENTS

| 2001/0017988 A1* | 8/2001 | Tanaka .................... G03B 17/02 |
|---|---|---|
| | | 396/542 |
| 2002/0135993 A1* | 9/2002 | Ueyama .............. H04M 1/0216 |
| | | 361/752 |
| 2009/0151988 A1* | 6/2009 | Lee ......................... H05K 1/028 |
| | | 29/829 |
| 2010/0273539 A1* | 10/2010 | Lee ...................... H04M 1/0274 |
| | | 455/575.4 |
| 2011/0003622 A1* | 1/2011 | Hwang .................. H05K 3/361 |
| | | 455/575.1 |

(Continued)

FOREIGN PATENT DOCUMENTS

JP         2010-192749 A      9/2010

*Primary Examiner* — Twyler L Haskins
*Assistant Examiner* — Wesley J Chiu
(74) *Attorney, Agent, or Firm* — Cowan, Liebowitz & Latman, P.C.

(57) ABSTRACT

An electronic apparatus includes a supporting member, a movable member supported by the supporting member movably with respect to the supporting member, a controller configured to control a movement of the movable member, a first flexible printed circuit board configured to electrically connect the movable member and the controller, and a first radio wave absorber having a sheet shape that overlays the first flexible printed circuit board and that is partially fixed to the first flexible printed circuit board.

21 Claims, 15 Drawing Sheets

(56) References Cited

U.S. PATENT DOCUMENTS

| | | | |
|---|---|---|---|
| 2011/0150441 A1* | 6/2011 | Ollila | H04N 5/2257 396/55 |
| 2018/0164603 A1* | 6/2018 | Taguchi | H04N 5/23287 |
| 2020/0329179 A1* | 10/2020 | Yeh | H04N 5/2253 |
| 2021/0306531 A1* | 9/2021 | Toda | H04N 5/22521 |

* cited by examiner

ELECTRONIC APPARATUS CAPABLE OF REDUCING ELECTROMAGNETIC FIELD NOISE

BACKGROUND OF THE INVENTION

Field of the Invention

The present invention relates to an electronic apparatus including a flexible printed circuit board that connects a movable unit movably supported by a supporting unit and a control circuit board.

Description of the Related Art

Conventionally, an electronic apparatus is known that includes a flexible printed circuit board configured to connect a control circuit board and a movable unit as a movable member that is movably supported by a fixing unit as a supporting member. For example, an image pickup apparatus having a function of optically corrects an image blur of an object realizes an image stabilization on the object by moving the movable unit supporting an image sensor in a direction orthogonal to an optical axis of the fixing unit.

Japanese Patent Laid-Open No. ("JP") 2010-192749 discloses an image pickup apparatus in which a fixing unit and a movable unit are electrically connected and in which a control circuit board controls driving of a movable unit.

According to a movement of the movable unit, it is possible to deform part of a wiring portion of the flexible printed circuit board described in JP 2010-192749. However, a reaction force is generated by a deformation of the wiring portion and becomes a load when the movable unit is driven. Depending on the configuration of the flexible printed circuit board, its flexibility may be reduced, which may inhibit the driving of the movable unit. Thus, the flexible printed circuit board may be formed as a thin layer and may include a wiring having a narrow width, so that the flexibility is improved.

However, in recent years, power consumption and the number of connection signals of the image sensor has been increasing as an image pickup apparatus has more improved function such as function of high-pixel motion image pickup or a high-speed continuous image pickup. Thus, if a high-speed transmission of many signals is attempted to perform with the flexible printed circuit board of the thin layer having the thin wiring, a communication performance may not be stable and a radiation (unwanted radiation) of electromagnetic field noise may be generated. The electromagnetic field noise may be reduced by adding a shield layer to the flexible printed circuit board or by attaching a sheet including a radio wave absorber to an entire surface of the flexible printed circuit board. However, these countermeasures may reduce the flexibility of the flexible printed circuit board, and may inhibit the driving of the movable unit.

SUMMARY OF THE INVENTION

The present invention provides an electronic apparatus that can reduce an electromagnetic field noise while suppressing an increase in load when a movable member shifts.

An electronic apparatus as one aspect of the present invention includes a supporting member, a movable member supported by the supporting member movably with respect to the supporting member, a controller configured to control a movement of the movable member, a first flexible printed circuit board configured to electrically connect the movable member and the controller, and a first radio wave absorber having a sheet shape that overlays the first flexible printed circuit board and that is partially fixed to the first flexible printed circuit board.

Further features of the present invention will become apparent from the following description of exemplary embodiments with reference to the attached drawings.

DESCRIPTION OF THE EMBODIMENTS

Referring now to the accompanying drawings, a description will be given of embodiments according to the present invention.

First Embodiment

Figure 1A:
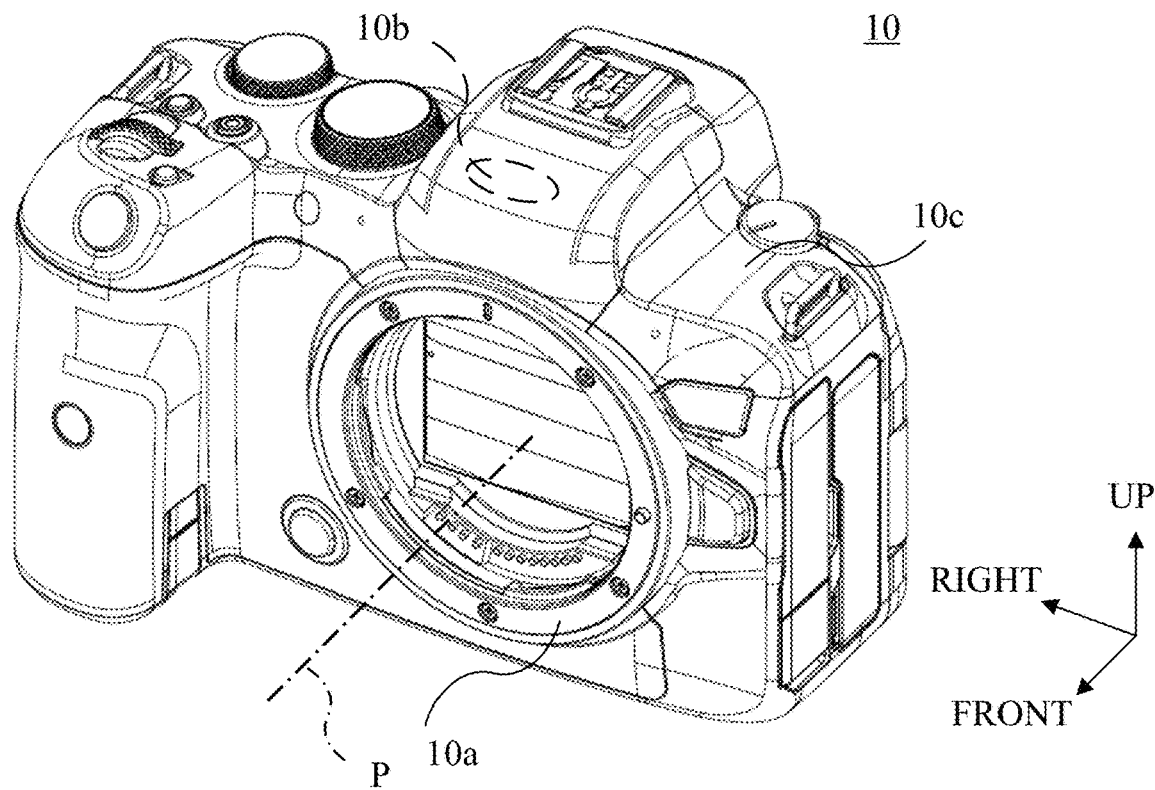
FIGS. 1A and 1B are perspective views illustrating an electronic apparatus according to a first embodiment.
Figure 1B:
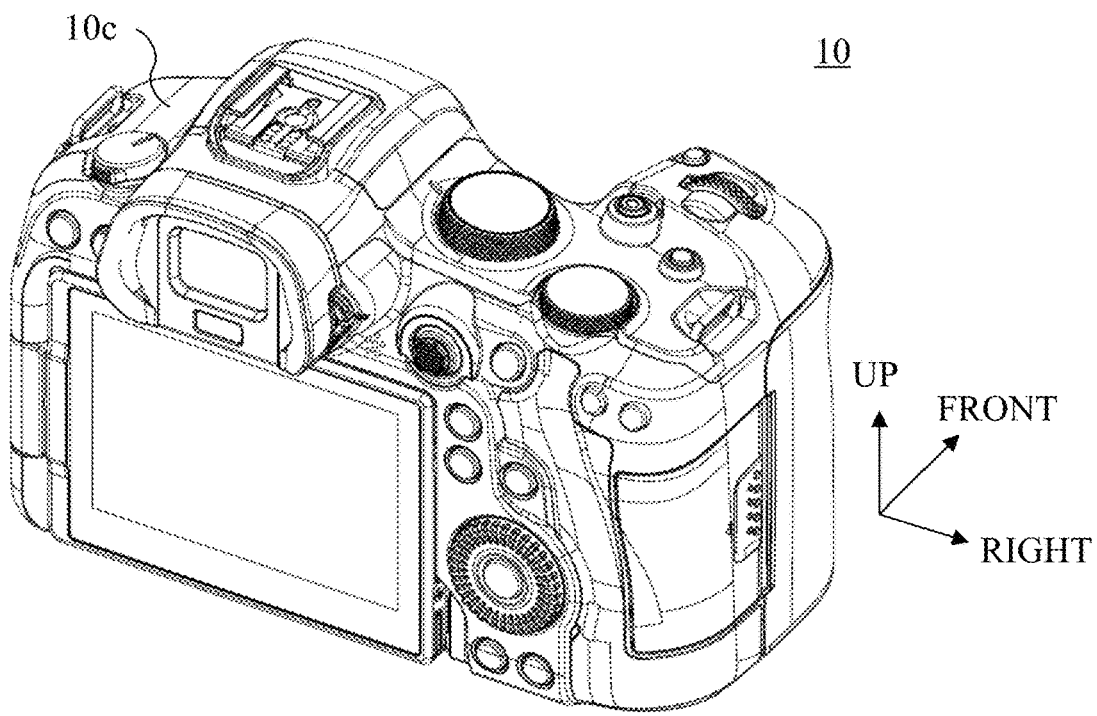

First, a description will be given of an electronic apparatus according to a first embodiment of the present invention with reference to FIGS. 1A and 1B. FIGS. 1A and 1B are perspective views of an electronic apparatus (image pickup apparatus 10) in which a wiring structure of a circuit board is used according to this embodiment. In this embodiment, the electronic apparatus is the image pickup apparatus 10, but the present invention is not limited to this. As illustrated in FIGS. 1A and 1B, directions of the image pickup apparatus 10 is defined. With respect to a direction viewed from a user, an up-down direction, a front direction, a rear direction, and a left-right direction are respectively defined. Thus, FIG. 1A is a perspective view of the image pickup apparatus 10 viewed from a front side, that is an object side, and FIG. 1B is a perspective view of the image pickup apparatus 10 viewed from a rear side, that is a user side.

The image pickup apparatus 10 is covered with an exterior 10c as a body frame including a plurality of members. The image pickup apparatus 10 includes a mount 10a on a front side. An interchangeable lens as a lens apparatus (not illustrated) is attachable to the mount 10a. The image pickup apparatus 10 includes a built-in wireless antenna 10b above the mount 10a. An axis passing through a center of the mount 10a substantially matches an optical axis P of the image pickup optical system of the interchangeable lens, the optical axis being also referred to as a predetermined axis or an image pickup optical axis.

Figure 2:
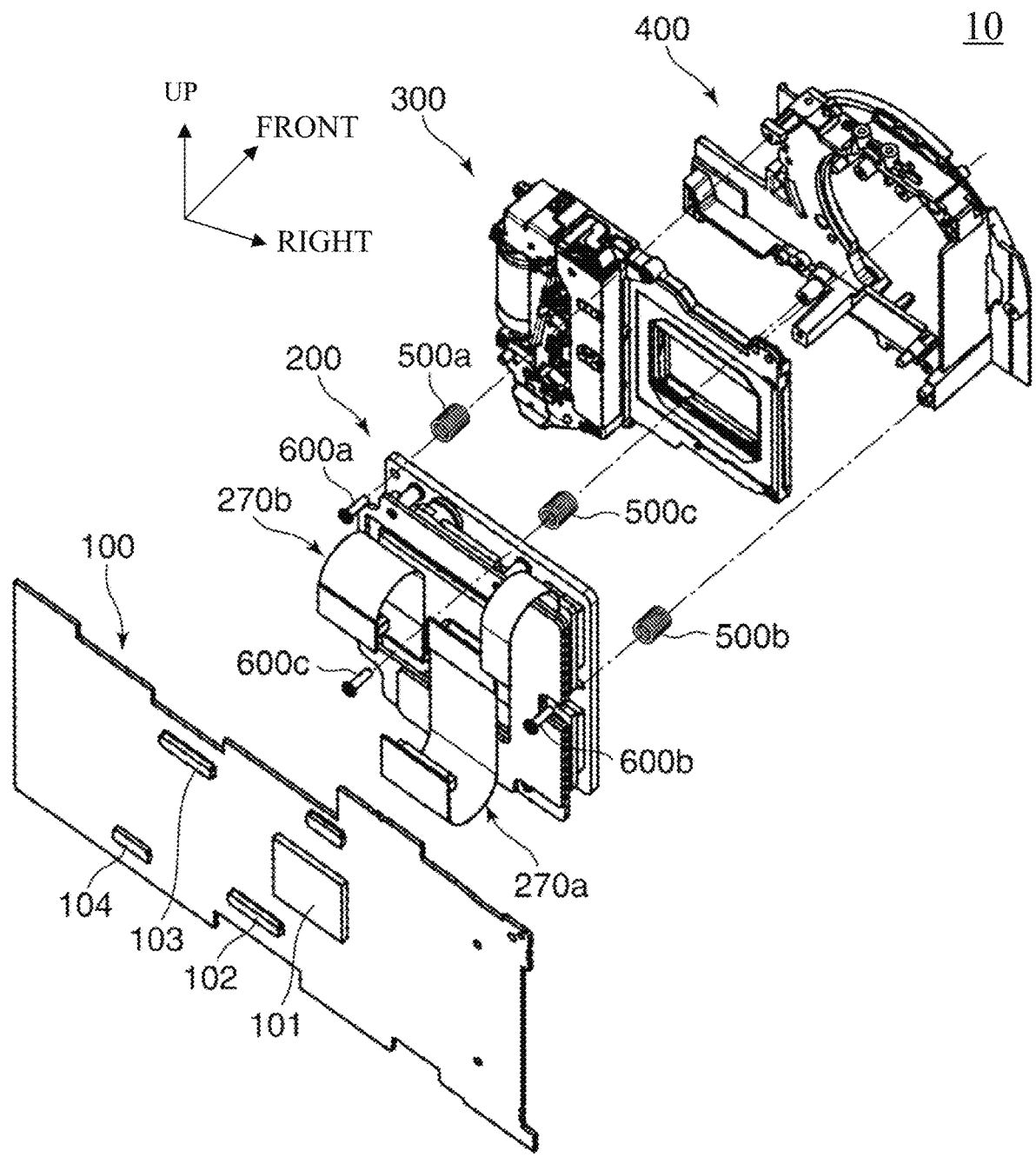
FIG. 2 is an exploded perspective view illustrating a main part of the electronic apparatus in a view from a rear side (user side) according to the first embodiment.

FIG. 2 is an exploded perspective view of a main part of the image pickup apparatus 10 viewed from the rear side, that is the user side. FIG. 2 does not illustrate the exterior 10c and the like. For easy understanding, FIG. 2 and subsequent drawings illustrate parts necessary for a description of the present invention, and do not illustrate parts unnecessary for the description.

The image pickup apparatus 10 includes a control circuit board 100 as a controller, an image stabilizing unit 200 as an image stabilization apparatus, a shutter unit 300 and a base member 400. The image stabilizing unit 200 is fixed to the base member 40 together with the shutter unit 300. The base member 400 and the control circuit board 100 are fixed to the exterior 10c. The image stabilizing unit 200 is held by the base member 400 to which the shutter unit 300 is attached and fixed. Three screws 600a. 600b and 600c and three coil springs 500a, 500b and 500c support the image stabilizing unit 200 movably in a direction along the optical axis P illustrated in FIG. 1A, with respect to the base member 400. By adjusting tightening amounts of the screws 600a, 600b and 600c, an operator can adjust an inclination, for the base member 400, of an image pickup surface of an image sensor 230 illustrated in FIG. 3. When the adjustment for the inclination of the image pickup surface is completed, the screws 600a. 600b and 600c are bonded and fixed to a fixing unit (supporting unit, supporting member) 200b of the image stabilizing unit 200 in order to prevent these screws from loosening.

A control IC 101 configured to control an image pickup signal and connectors 102, 103 and 104 are mounted on the control circuit board 100. Various electronic components (not illustrated) are mounted on the control circuit board 100, the various electronic components being such as a chip resistor, a ceramic condenser, an inductor, a transistor and the like. The connectors 102 and 103 are connected to a first flexible printed circuit board 270a and a second flexible printed circuit board 270b each of which is a flexible printed circuit board extending from the image stabilizing unit 200. Thereby, the control circuit board 100 is electrically connected to the image stabilizing unit 200. The connector 104 is connected to a flexible printed circuit board (not illustrated) extending from the shutter unit 300, and is configured to electrically connect the control circuit board 100 and the shutter unit 300.

Figure 3:
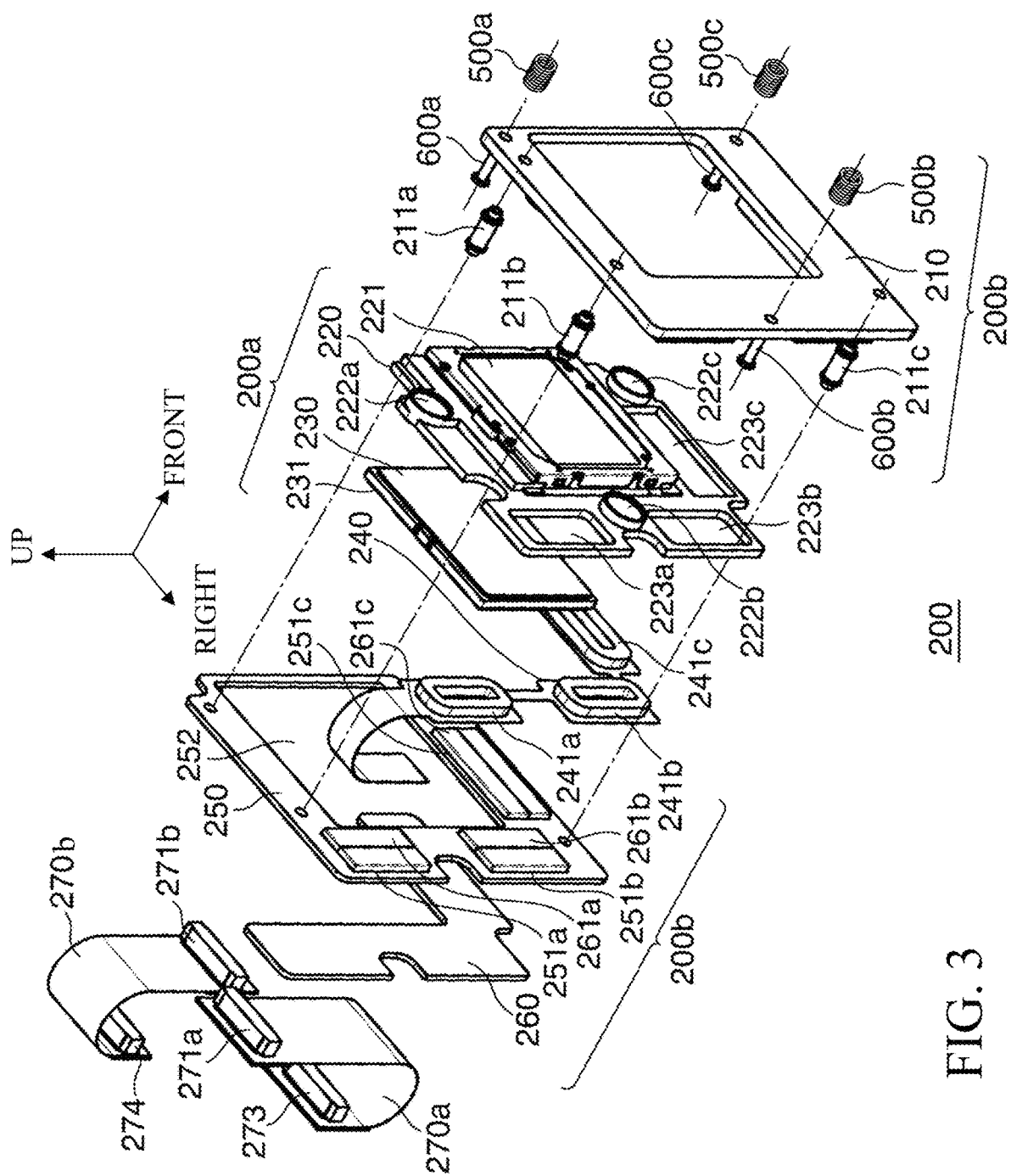
FIG. 3 is a perspective view illustrating an image stabilizing unit according to the first embodiment.
Figure 4:
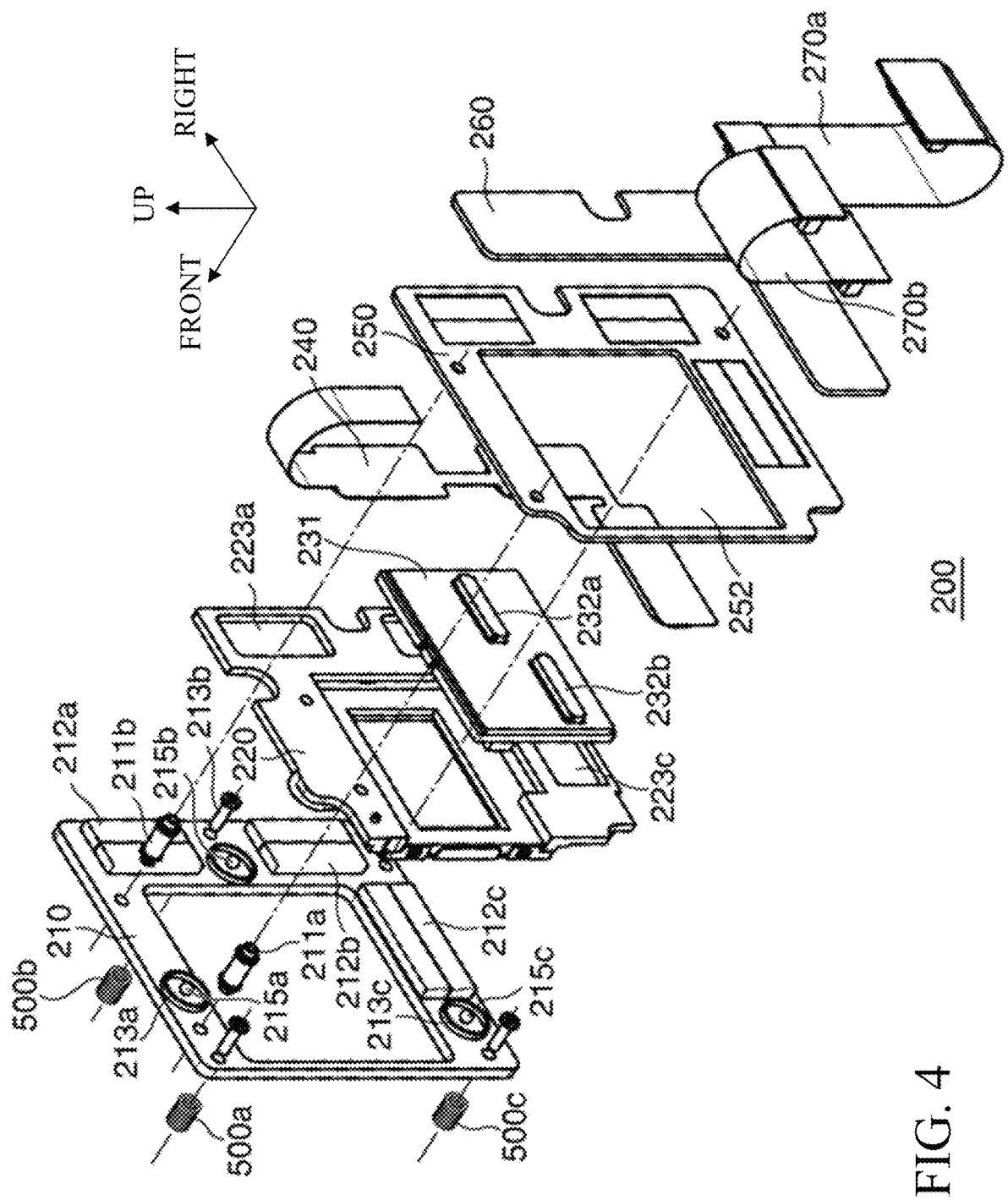
FIG. 4 is a perspective view illustrating the image stabilizing unit according to the first embodiment.

Next, a description will be given of the image stabilizing unit 200 with reference to FIGS. 3 and 4. FIGS. 3 and 4 are exploded perspective views illustrating the image stabilizing unit 200. The image stabilizing unit 200 includes a movable unit 200a as a movable member and a fixing unit 200b as a supporting member. The movable unit 200a includes the image sensor 230. The fixing unit 200b is fixed to the base member 400. The fixing unit 200b supports the movable unit 200a movably, with respect to the fixing unit 200b, in a plane direction orthogonal to the optical axis P. When the movable unit 200a moves in the direction orthogonal to the optical axis P, the function is realized of optically stabilizing an image.

The fixing unit 200b mainly includes a front yoke 210, a base plate 250 and a rear yoke 260. The movable unit 200a mainly includes a sensor holder 220 and a third flexible printed circuit board 240. Each of the first flexible printed circuit board 270a and the second flexible printed circuit board 270b connects the movable unit 200a and the control circuit board 100. The third flexible printed circuit board 240 connects the sensor holder 220 and the control circuit board 100. The first flexible printed circuit board 270a, the second flexible printed circuit board 270b and the third flexible printed circuit board 240 are flexible printed circuit boards having flexibility.

The image sensor 230 is mounted on an image sensor circuit board 231. The image sensor 230 is a CMOS sensor or a CCD sensor, and is configured to convert an optical image of an object into an electric signal. An image sensor 230 and an image sensor circuit board 231 are bonded and fixed to the sensor holder 220. In the sensor holder 220, a low-pass filter 221 is disposed on a more front side than where the image sensor 230 is disposed. The low-pass filter 221 is configured to prevent an infrared ray from entering and to prevent a color moire and the like from occurring. Three openings 223a, 223b and 223c are formed on the sensor holder 220. Three coils 241a, 241b and 241c are mounted on the third flexible printed circuit board 240 as illustrated in FIG. 3. The third flexible printed circuit board 240 is incorporated, bonded, and fixed to the sensor holder 220 from a rear side and the coils 241a, 241b and 241c are housed inside the openings 223a, 223b and 223c.

As illustrated in FIG. 3, three ball receiving portions 222a. 222b and 222c are formed on the sensor holder 220. As illustrated in FIG. 4, on a front yoke 210 and ball receiving portions 213a, 213b and 213c are formed at positions facing the ball receiving portions 222a, 222b and 222c. The sensor holder 220 and a front yoke 210 hold each of the balls 215a, 215b, and 215c between the ball receiving portions which are facing each other, in a state where the image sensor 230 and the image sensor circuit board 231 are bonded and fixed to the sensor holder 220. Thereby, the balls 215a, 215b and 215c are supported.

Magnets 212a. 212b and 212c are bonded and fixed to the front yoke 210 at positions facing the sensor holder 220. On the sensor holder 220, plate members (not illustrated) of ferromagnetic material such as iron are attached together at positions facing the magnets 212a, 212b and 212c. When the front yoke 210 is made to approach the sensor holder 220 to a certain distance, the sensor holder 220 is magnetically attracted to the front yoke 210 and the front yoke 210 supports the sensor holder 220 movably in the plane direction orthogonal to the optical axis P via the balls 215a, 215b and 215c.

As illustrated in FIG. 4, the magnets 212a, 212b and 212c are attached to the front yoke 210 at positions facing the coils 241a, 241b and 241c. Columns 211a, 211b and 211c are erected on the front yoke 210 toward the base plate 250. One end of each of the columns 211a. 211b and 211c is press-fitted into the base plate 250. The front yoke 210 and the base plate 250 are bonded so that the sensor holder 220 is held.

Openings 251a, 251b and 251c are formed on the base plate 250 at different positions in a view from the optical axis P direction, and the magnets 261a, 261b and 261c are incorporated in the openings 251a, 251b and 251c, respectively. In the view from the optical axis P direction, the magnets 261a, 261b and 261c are respectively formed in substantially the same position and in the same shape as those of the corresponding coils 241a, 241b and 241c. The magnets 261a, 261b and 261c are disposed at positions where centers match between the magnets 261a, 261b and 261c and the corresponding coils 241a, 241b and 241c, respectively.

The operator sets the rear yoke 260 on the base plate 250 from the rear side while making the magnets 261a. 261b and 261c housed inside the openings 251a, 251b and 251c, respectively. The rear yoke 260 and the base plate 250 are each made of ferromagnetic material. Only by adjusting the position of the rear yoke 260 to which the magnets 261a, 261b and 261c are attached and by contacting the rear yoke 260 to the base plate 250, the operator can make them magnetically attract each other, and can attach those two parts without using an adhesive material.

An opening 252 is formed on the base plate 250. When the sensor holder 220 is held between the front yoke 210 and the base plate 250, the image sensor circuit board 231 is exposed from the rear side of the opening 252. As illustrated in FIG. 4, connectors 232a and 232b are mounted on the image sensor circuit board 231. As illustrated in FIG. 3, a connector 271a is mounted on the first flexible printed circuit board 270a, and a connector 271b is mounted on the second flexible printed circuit board 270b. The operator makes the first flexible printed circuit board 270a and the second flexible printed circuit board 270b pass through the opening 252 from the rear side, and incorporates each of them into the image sensor circuit board 231. The connector 232a and the connector 271a are made to engage, and the connector 232b and the connector 271b are made to engage. The connectors 232a and 271a is in a relationship of a plug connector and a receptacle connector, each of which has a corresponding fitting shape. The connectors 232b and 271b is in a relationship of a plug connector and a receptacle connector, each of which has a corresponding fitting shape. Each of the connectors 271a and 271b has a structure having two rows of signal terminal lines which are parallel to each other.

The first flexible printed circuit board 270a and the second flexible printed circuit board 270b both have long plate-like shapes, and respectively have the connectors 271a and 271b mounted on one end of each of them. Connectors 273 and 274 are respectively mounted on the other ends in a wiring direction, that is a longitudinal direction, of the first flexible printed circuit board 270a and the second flexible printed circuit board 270b. The connector 273 and the connector 102 mounted on the control circuit board 100 illustrated in FIG. 2 are in a relationship of a plug connector and a receptacle connector each of which has a corresponding fitting shape. Similarly, the connector 274 and the connector 103 mounted on the control circuit board 100 illustrated in FIG. 2 are in a relationship of a plug connector and a receptacle connector each of which has a corresponding fitting shape. Similarly to the connectors 271a and 271b, each of the connectors 273 and 274 has a structure having two rows of signal terminal lines which are parallel to each other.

When the connectors 271a and 271b illustrated in FIG. 3 are respectively connected to the connectors 232a and 232b illustrated in FIG. 4, the first flexible printed circuit board 270a and the second flexible printed circuit board 270b are electrically connected to the image sensor circuit board 231. Thereby, the connectors 271a and 271b are fixed to the movable unit 200a.

Figure 5:
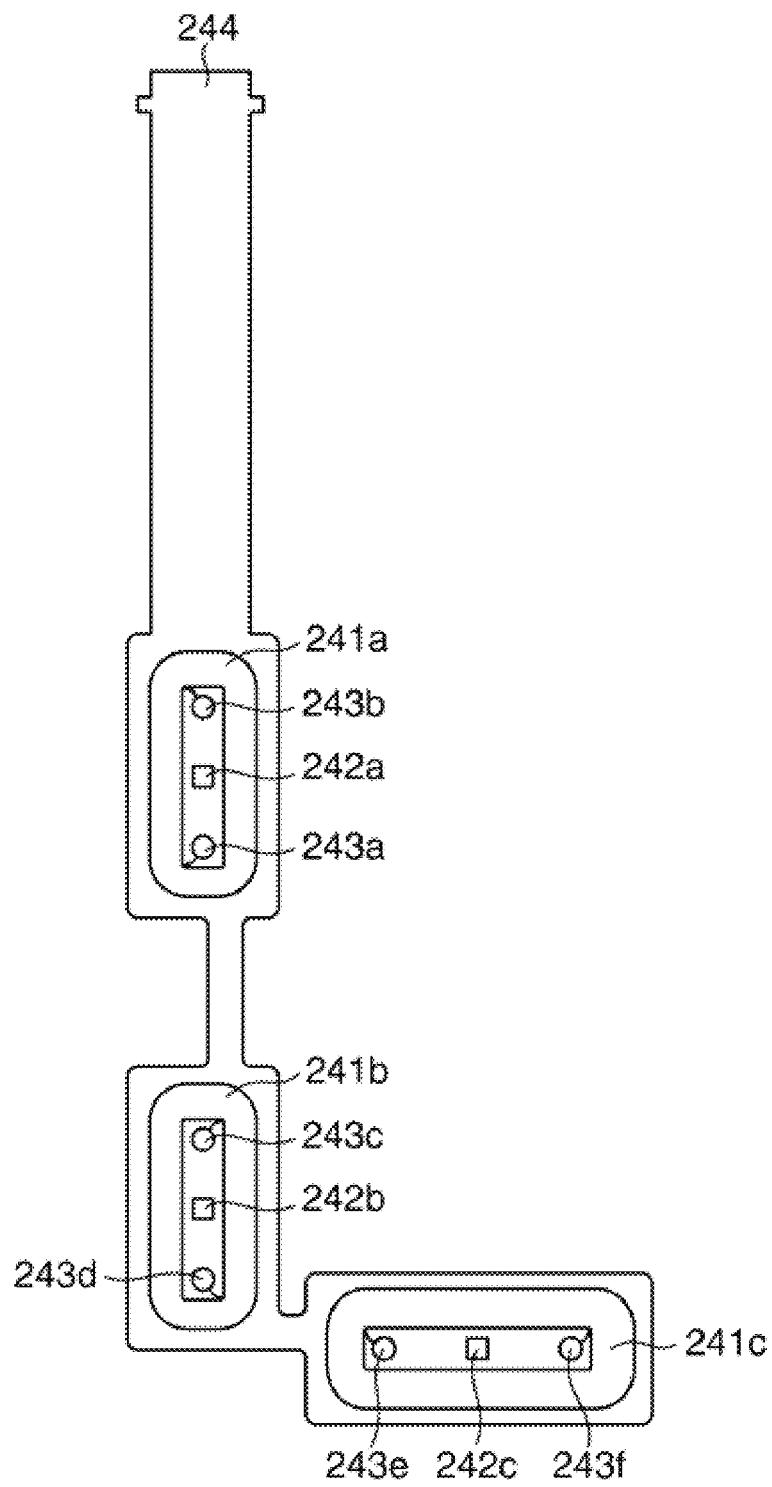
FIG. 5 is a front view illustrating a third flexible printed circuit board according to the first embodiment.

Next, the third flexible printed circuit board 240 will be described with reference to FIG. 5. FIG. 5 is a front view illustrating the third flexible printed circuit board 240. As described above, the coils 241a, 241b and 241c are bonded and fixed to the third flexible printed circuit board 240. On the third flexible printed circuit board 240, solder lands 243a, 243b, 243c, 243d, 243e and 243f are formed each of which is configured to electrically connect with a winding wire of a coil. The operator solders a winding start end and a winding end end of the coil 241a to the solder lands 243a and 243b, respectively. Similarly, the operator solders a winding start end and a winding end end of the coil 241b to the solder lands 243c and 243d, respectively, and solders a winding start end and a winding end end of the coil 241c to the solder lands 243e and 243f, respectively. Each coil is electrically connected to the third flexible printed circuit board 240 by the soldering.

In the third flexible printed circuit board 240, Hall elements 242a, 242b, 242c are mounted inside the winding wires of the coils 241a, 241b and 241c. A connector terminal portion 244 is formed on the third flexible printed circuit board 240. A wiring pattern from each solder land or each hall element is developed inside the third flexible printed circuit board 240 and connected to a connector terminal portion (not illustrated). The connector terminal portion 244 is electrically connected by being connected to the connector mounted on the control circuit board 100.

As described above, the coils 241a, 241b and 241c are disposed on the magnetic field environment formed by the magnets 212a, 212b and 212c installed on the front yoke 210 and the magnets 261a, 261b and 261c installed on the rear yoke 260. When an electric current flows through these coils, a Lorentz force is generated in each coil, and the force as a thrust can shift the sensor holder 220 in the plane direction orthogonal to the optical axis P The Hall elements 242a, 242b and 242c mounted inside the coils 241a. 241b and 241c are configured to detect a change in a magnetic force, the change being caused by the sensor holder 220 moving relative to the magnets 212a, 212b and 212c. Based on the detection result, it is possible to detect a shift amount, with respect to the fixing unit 200b, in the plane direction orthogonal to the optical axis P of the movable unit 200a.

According to the definition of the direction described above, when the image stabilizing unit 200 is in an assembled state, the coil 241c is in a lower left portion and the coil 241a is in an upper right portion of the image sensor 230. On the control circuit board 100 illustrated in FIG. 2, the connectors 102 and 104 are mounted on a lower portion and the connector 103 is mounted on an upper portion. On the control circuit board 100, the connectors 102, 103 and 104 are mounted on a rear surface. On the image sensor circuit board 231, the connectors 232a and 232b are mounted on a rear surface.

The movable unit 200a translates in the up-down direction during an image stabilization in a pitch direction which is a rotation in the left-right direction. The movable unit 200a translates in the left-right direction during an image stabilization in a yaw direction, which is a rotation in the up-down direction. The movable unit 200a rotates around an axis parallel to a front-back direction during an image stabilization in a roll direction which is a rotation in the front-back direction.

Figure 6:
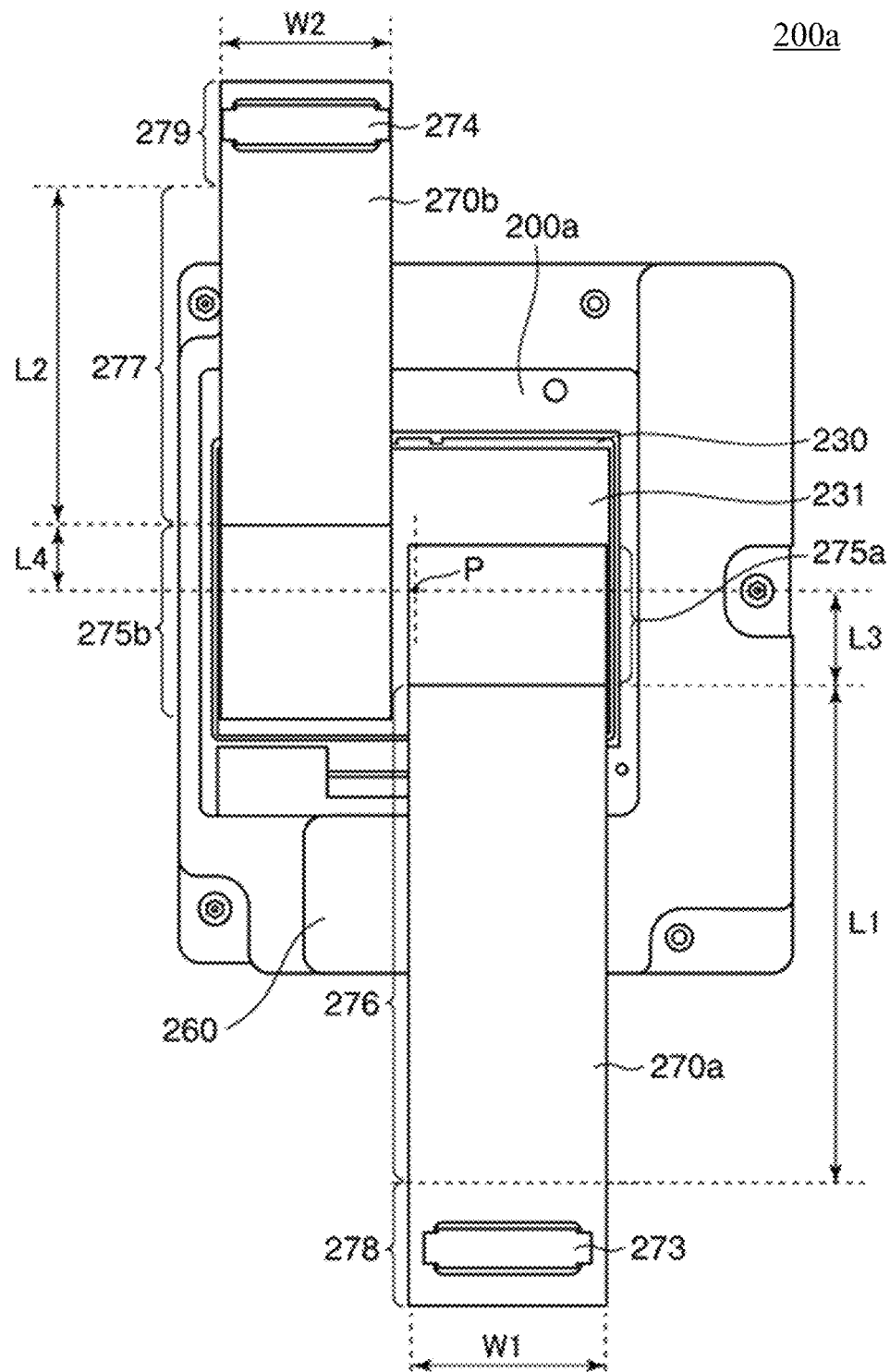
FIG. 6 is a rear view illustrating a movable unit, to which a first flexible printed circuit board and a second flexible printed circuit board are fixed, according to the first embodiment.
Figure 7:
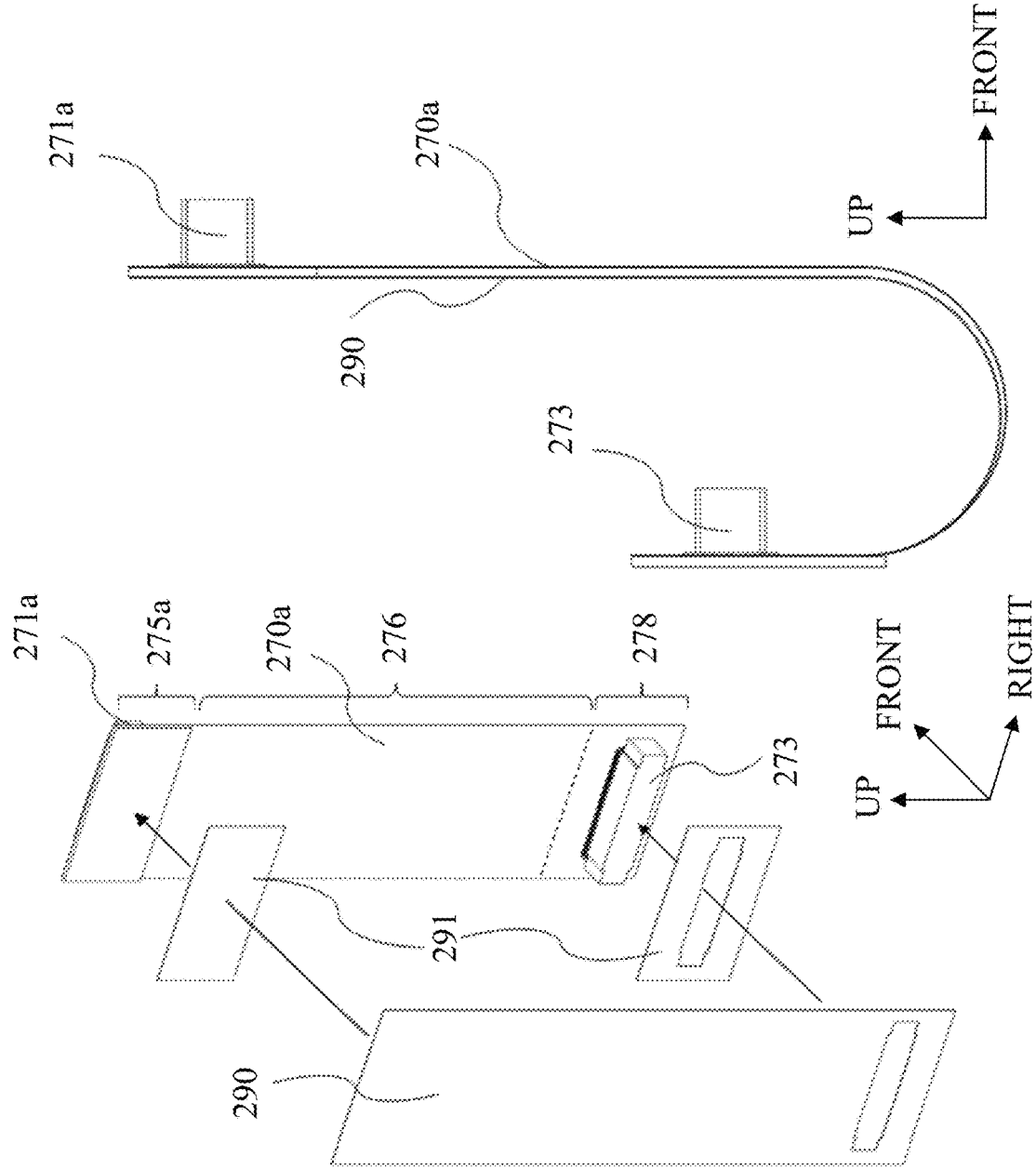
FIG. 7A and FIG. 7B are explanatory diagrams illustrating a countermeasure against electromagnetic field noise provided to the first flexible printed circuit board according to the first embodiment.
Figure 8:
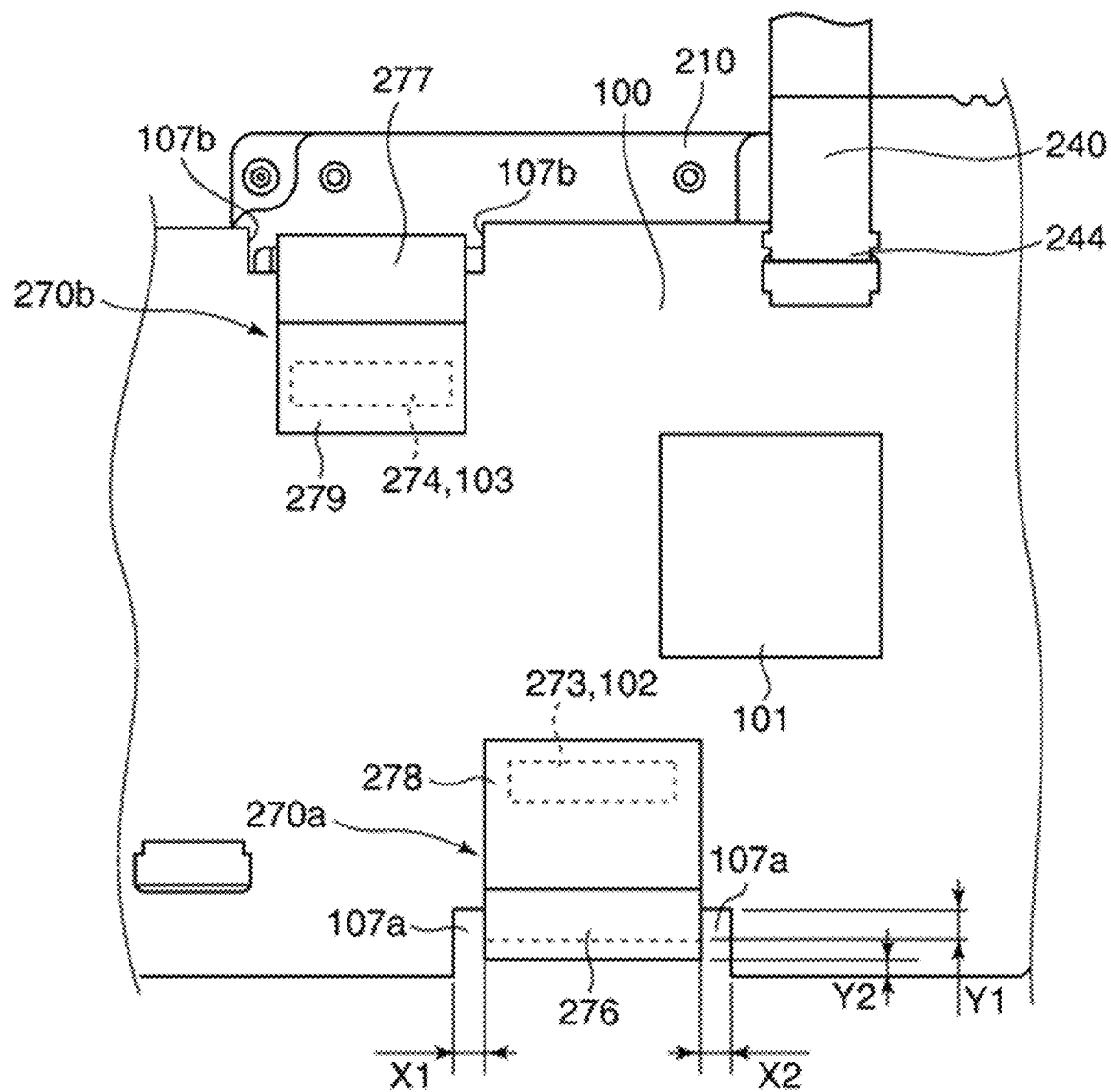
FIG. 8 is a diagram illustrating the movable unit attached to a control circuit board in a view from the rear side, according to the first embodiment.
Figure 9:
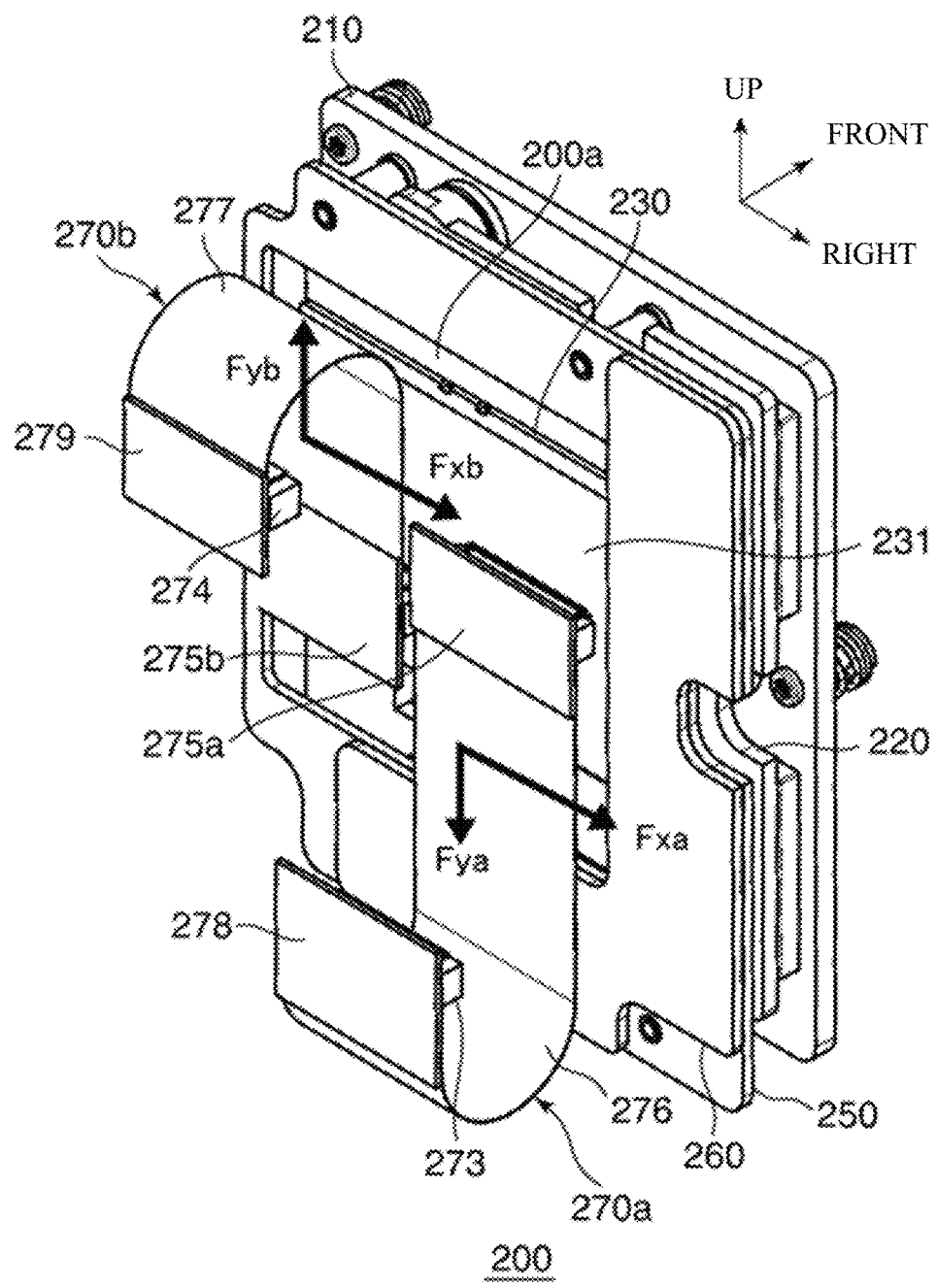
FIG. 9 is a perspective view illustrating the image stabilizing unit according to the first embodiment.

Next, a description will be given of the configurations of the first flexible printed circuit board 270a and the second flexible printed circuit board 270b with reference to FIGS. 6 to 9. FIG. 6 is a rear view illustrating the movable unit 200a to which the first flexible printed circuit board 270a and the second flexible printed circuit board 270b are fixed. FIGS. 7A and 7B are explanatory diagrams of a countermeasure against an electromagnetic field noise applied to the first flexible printed circuit board 270a. FIG. 8 is a rear view illustrating a state where the movable unit 200a is attached to the control circuit board 100 and where the first flexible printed circuit board 270a and the second flexible printed circuit board 270b are fixed to the movable unit 200a. In FIG. 8, the connectors 273 and 274 are connected to the connectors 102 and 103. FIG. 9 is a perspective view illustrating the image stabilizing unit 200.

As illustrated in FIG. 6, each of the first flexible printed circuit board 270a and the second flexible printed circuit board 270b is roughly divided into three regions, that is, two rigid parts (connecting portions) and a flexible part (wiring portion) that connects those rigid parts. The rigid parts (connecting portions) are made rigid by bonding insulation reinforcing material such as glass epoxy resin to the flexible part (wiring portion) with a thermo-setting adhesive or the like, and the flexible part (wiring portion) has a connector mounted on the surface.

As illustrated in FIG. 6, the first flexible printed circuit board 270a includes a first connecting portion 275a, a first wiring portion 276 and a second connecting portion 278 in order from a side closer to the connector 271a illustrated in FIG. 3 in the wiring direction, that is the longitudinal direction. The first wiring portion 276 extends from the first connecting portion 275a in a downward direction, that is also referred to as a first direction, orthogonal to the optical axis P, that is also referred to as a predetermined axis. The connector 271a is disposed on the first connecting portion 275a, and the connector 273 is disposed on the second connecting portion 278.

The second flexible printed circuit board 270b includes a third connecting portion 275b, a second wiring portion 277, and a fourth connecting portion 279 in order from a side closer to the connector 271b illustrated in FIG. 3 in the wiring direction, that is the longitudinal direction. From the third connecting portion 275b, the second wiring portion 277 extends in a direction (second direction) that is orthogonal to the optical axis P and that is an upward direction opposite to the downward direction, that is the first direction. The connector 271b is disposed on the third connecting portion 275b, and the connector 274 is disposed on the fourth connecting portion 279.

The first connecting portion 275a, the third connecting portion 275b, the second connecting portion 278 and the fourth connecting portion 279 are made rigid by bonding insulation reinforcing material such as glass epoxy resin with thermo-setting adhesive or the like. On the connecting portion, each inter-circuit board connector, that is each of the connectors 271a, 271b, 273 and 274, is mounted on a surface opposite to the surface on which the reinforcing material is attached.

As illustrated in FIG. 6, in the wiring direction of the first flexible printed circuit board 270a, the first wiring portion 276 is disposed on an area between the first connecting portion 275a and the second connecting portion 278. The first wiring portion 276 has flexibility and is configured to electrically connect the connector 271a and the connector 273. In the wiring direction of the second flexible printed circuit board 270b, the second wiring portion 277 is disposed on an area between the third connecting portion 275b and the fourth connecting portion 279. The second wiring portion 277 has flexibility and is configured to electrically connect the connector 271b and the connector 274.

Here, with reference to FIGS. 7A and 7B, a detailed description will be given of a configuration relating to the countermeasure against the electromagnetic field noise, the countermeasure being provided on the first flexible printed circuit board 270a. A high-speed transmission line is wired on the first flexible printed circuit board 270a, and details of the wiring pattern will be described later. In the high-speed transmission line, the electromagnetic field noise may be generated from high-speed transmission wiring, and the connecting portion between the circuit boards is likely to be a noise source. That is, the connector 271a mounted on the first connecting portion 275a and the connector 273 mounted on the second connecting portion 278 are likely to be noise sources.

FIG. 7A is an exploded perspective view illustrating attachment positions of electromagnetic field noise countermeasure components applied to the first flexible printed circuit board 270a. FIG. 7B is a side view viewed from the right side illustrating the first flexible printed circuit board 270a to which the electromagnetic field noise countermeasure component is attached and to which the circuit board is connected, where the first flexible printed circuit board 270a is extracted for a simplification of a description.

A radio wave absorber 290 as a first radio wave absorber is a thin sheet-like member of about 100 μm thick and includes a magnetic layer containing powder of magnetic material such as sendust or ferrite in this embodiment. However, the present invention is not limited to this, and may use other dielectric or non-conductor. The double-sided tape 291 is, for example, an acrylic double-sided tape, and as illustrated in FIG. 7A, the double-sided tape 291 is disposed on an insulation reinforcing material portion of a back surface of the connector 271a and on a peripheral portion of the connector 273, and partially make the radio wave absorber 290 attached to the first flexible printed circuit board 270a. That is, the radio wave absorber 290 is attached to the rigid part of the first flexible printed circuit board 270a, but the radio wave absorber 290 is not attached to the flexible part of the first flexible printed circuit board 270a.

The radio wave absorber 290 bends following the first flexible printed circuit board 270a in a circuit board connected state as illustrated in FIG. 7B, and the double-sided tape 291 does not exist in the flexible part. In general, it is known that the presence of an adhesive layer enhances a repulsive force in the bending portion. In this embodiment, the adhesive layer, that is the double-sided tape 291, is not disposed on the flexible part, so that it is possible to suppress an increase in load caused by deformation of each flexible printed circuit board when the movable unit 200a shifts.

As illustrated in FIG. 8, a first notch 107a is formed on the lower side, that is an edge in the first direction, of the control circuit board 100. A second notch 107b is formed on the upper side, that is an edge in the second direction, of the control circuit board 100. The first wiring portion 276 of the first flexible printed circuit board 270a is wired through the first notch 107a, and the second wiring portion 277 of the second flexible printed circuit board 270b is wired through the second notch 107b. That is, the first wiring portion 276 extends downward from the first connecting portion 275a, curves to the rear side, passes through the first notch 107a, and extends upward. The connector 273 fits in the connector 102. On the other hand, the second wiring portion 277 extends upward from the third connecting portion 275b, curves to the rear side, passes through the second notch 107b, and extends downward. The connector 274 fits in the connector 103.

As illustrated in FIG. 8, the second wiring portion 277 and the first wiring portion 276 are configured to be wired and to surround parts of the upper and lower sides of the control circuit board 100. The second wiring portion 277 and the first wiring portion 276 are separated and respectively pulled out in two routes of upper and lower in the pitch direction of image shake vibration, that is, a translational direction of the movable unit 200a. By setting such a pull-out direction, the loads can be made more uniformly between when the movable unit 200a is driven in the rightward direction and in the leftward direction, the load being generated by the deformation of each of the flexible printed circuit boards 270a and 270b.

Here, a description will be given of the load caused by the deformation of each flexible printed circuit board and a control of the movable unit 200a with reference to FIG. 9. A case is considered where the movable unit 200a shifts in the leftward direction. In this embodiment, when the movable unit 200a shifts in the leftward direction, as illustrated in FIG. 9, rightward forces Fxa and Fxb are generated as reaction forces generated by the flexible printed circuit boards 270a and 270b, respectively. In the up-down direction, an upward force Fya is generated as a reaction force generated by the first flexible printed circuit board 270a, and a downward force Fyb is generated as a reaction force generated by the second flexible printed circuit board 270b.

However, in the first flexible printed circuit board 270a and the second flexible printed circuit board 270b, the pull-out directions are divided into two routes of the upper and lower. Hence, it is possible to balance loads in the up-down directions because sizes are substantially same between the force Fya and the force Fyb. The loads occur substantially only in the rightward direction on the first flexible printed circuit board 270a and the second flexible printed circuit board 270b, and the size thereof is the sum of the force Fxa and the force Fxb. Since the load in the up-down direction is substantially zero, a required control is a driving control in the left-right direction only, and thus the control is simple. An increase in the load and a complication of control may lead to an increase in size of a magnet and a coil required for a highly accurate control, and may lead to an increase in size of the image pickup apparatus 10. Thus, it can be said that suppressing an increase in the load and simplifying the control may contribute to downsize the image pickup apparatus 10 and to reduce power consumption.

As illustrated in FIG. 6, in the wiring direction of the first flexible printed circuit board 270a, a length L1 of the first wiring portion 276 represents a length from a boundary between the first wiring portion 276 and the first connecting portion 275a to a boundary between the first wiring portion 276 and the second connecting portion 278. In the wiring direction of the second flexible printed circuit board 270b, a length L2 of the second wiring portion 277 represents a length from a boundary between the second wiring portion 277 and the third connecting portion 275b to a boundary between the second wiring portion 277 and the fourth connecting portion 279. In the up-down direction, L3 is a length from the optical axis P to the boundary between the first connecting portion 275a and the first wiring portion 276, and L4 is a length from the optical axis P to the boundary between the third connecting portion 275b and the second wiring portion 277. In a left-right direction, W1 is a width of the first wiring portion 276, and W2 is a width of the second wiring portion 277.

Basically, the length L1 and the length L2 may be substantially the same length, and the length L3 and the length L4 may be the same so that a load balance is made to more uniform, the load being caused by the deformation of each of the first flexible printed circuit board 270a and the second flexible printed circuit board 270b. The width W1 and the width W2 may be substantially the same.

On the other hand, a layer configuration and a wiring width may vary the load generated by the deformation of each flexible printed circuit board, and the length L and the width W are adjusted so that a load variation is cancelled. Thereby, the load generated by the deformation of each of the first flexible printed circuit board 270a and the second flexible printed circuit board 270b can be made more uniform and it is possible to contribute to downsize the image pickup apparatus 10 and to reduce power consumption.

FIG. 8 illustrates an initial state in which the movable unit 200a does not shift. In the initial state of the distances between the first wiring portion 276 and the first notch 107a in the left-right direction, a distance in the left side is X1 and a distance in the right side is X2. That is, a notch width in the left-right direction of the first notch 107a is a width of the first wiring portion 276+X1+X2. On the other hand, Y1 represents a distance between a position of the first notch 107a in a depth direction and a lowermost end of a curved inner surface of the first wiring portion 276, that is a curved inner surface of the radio wave absorber 290. Y2 represents a distance between an outermost lower end position of the control circuit board 100 and a curved outer surface of the first wiring portion 276.

The distances X1, X2 and Y1 are set so that the first wiring portion 276 does not contact the left and right edges and the upper edge of the first notch 107a even when the movable unit 200a shifts at a maximum amount with respect to the fixing unit 200b. The distance Y2 is set so that the first wiring portion 276 does not protrude from the first notch 107a and fits inside an outermost shape of the control circuit board 100, even when the movable unit 200a shifts at the maximum amount with respect to the fixing unit 200b.

First, the movable unit 200a translates in the left-right direction for the image stabilization in the yaw direction. The distance X1 is set to a value larger than a maximum movable amount of translational movement in the leftward direction of the movable unit 200a, the maximum movable amount being from a state where the center of the movable unit 200a matches the optical axis P, that is the initial state. The distance X2 is set to a value larger than a maximum movable amount of the translational movement in the rightward direction of the movable unit 200a from the initial state. The movable unit 200a translates in the up-down direction for the image stabilization in the pitch direction. The distance Y1 is set to a value larger than a maximum movable amount of the translational movement in the upward direction of the movable unit 200a from the initial state. The distance Y2 is set to a value larger than a maximum movable amount of the translational movement in the downward direction of the movable unit 200a from the initial state.

The positional relationship between the second notch 107b and the second wiring portion 277 is set similarly to the positional relationship between the first notch 107a and the first wiring portion 276. Thus, even when the movable unit 200a shifts by the maximum amount with respect to the fixing unit 200b, the second wiring portion 277 does not contact the left and right edges and the lower edge of the second notch 107b. Even when the movable unit 200a shifts by the maximum amount with respect to the fixing unit 200b, the second wiring portion 277 does not protrude from the second notch 107b, and fits inside the outermost shape of the control circuit board 100.

Figure 10:
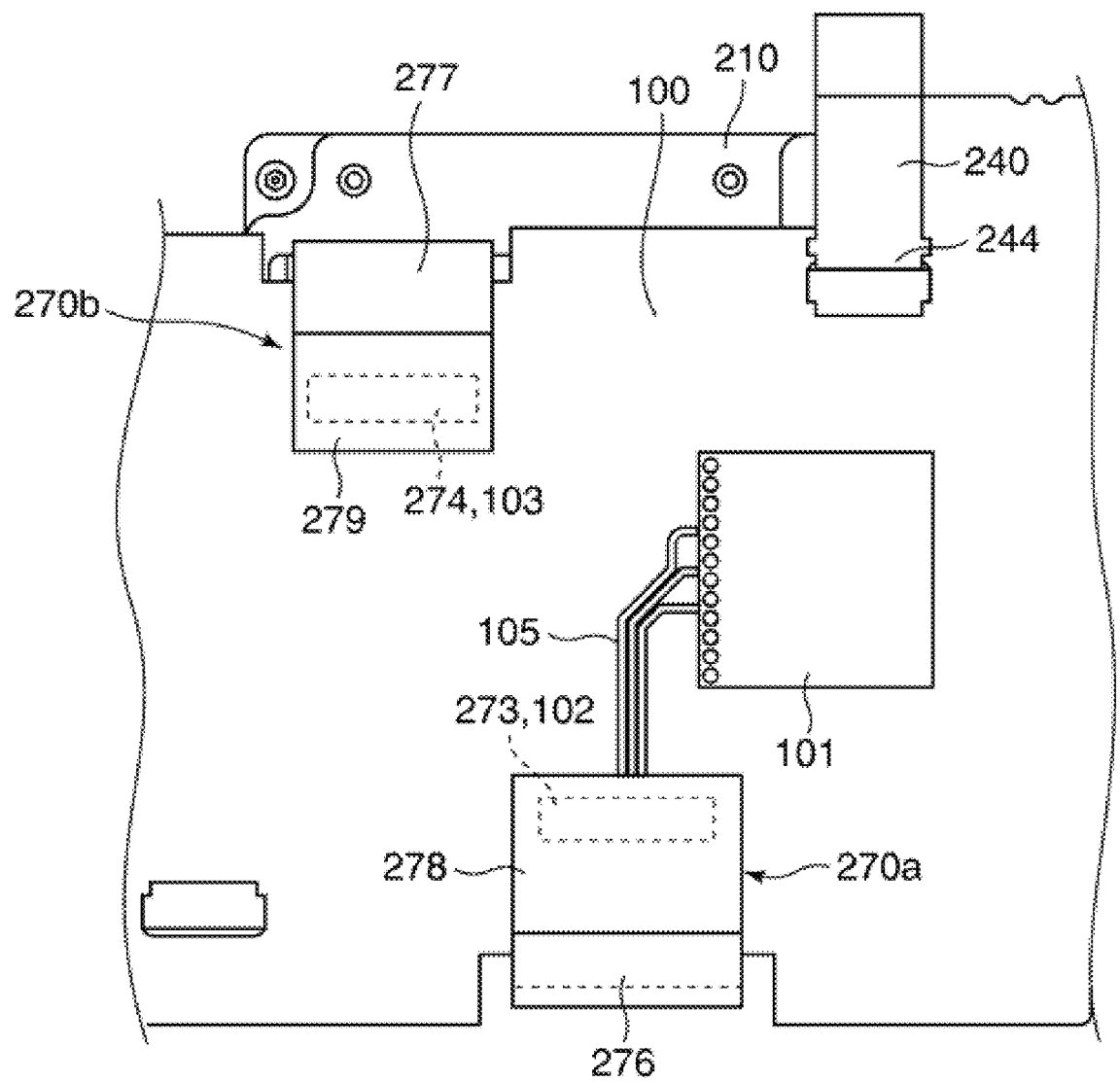
FIG. 10 is a front view illustrating the wiring pattern developed inside the control circuit board according to the first embodiment.

Next, with reference to FIGS. 6 to 10, a description will be given of a wiring pattern developed inside the image pickup apparatus 10. FIG. 10 is a front view illustrating a wiring pattern developed inside the control circuit board 100.

On the first flexible printed circuit board 270a, the high-speed transmission wiring is formed which is electrically connected from the connector 271a illustrated in FIG. 3 to the connector 273 illustrated in FIG. 6, via the first wiring portion 276. This high-speed transmission wiring is a transmission line using a transmission method such as an LVDS (Low Voltage Differential Signal) and having a pair of two signal lines. The image pickup apparatus 10 uses this high-speed transmission wiring to transmit an image pickup signal between the image sensor 230 and the control circuit board 100, and supports high-speed transmission of the image pickup signal. The first flexible printed circuit board 270a is wired with ground wiring, wiring necessary for the image sensor 230, and the like, in addition to the high-speed transmission wiring.

On the second flexible printed circuit board 270b, power supply wiring is formed and is configured to electrically connect from the connector 271b illustrated in FIG. 3 to the connector 274 illustrated in FIG. 6 via the second wiring portion 277. The second flexible printed circuit board 270b is wired with not only power supply wiring but also ground wiring, wiring necessary for the image sensor 230, and the like.

Each of the first flexible printed circuit board 270a and the second flexible printed circuit board 270b has a multilayer laminated structure, and in this embodiment, has a two-layer structure. On the first flexible printed circuit board 270a and the second flexible printed circuit board 270b, the connectors 273 and 274 are respectively mounted on the surfaces opposite to the surfaces on which the connectors 271a and 271b are mounted. The high-speed transmission wiring extends from a signal terminal line of the connector 271a, and is electrically connected to a signal terminal line disposed on a terminal line on a back side in a view from the connector 271a, among the two parallel signal terminal lines of the connector 273. Specifically, after the high-speed transmission wiring passes through a back-side surface of a mounting surface of the connector 273, the high-speed transmission wiring is electrically connected to the transmission line wired on the mounting surface of the connector 273 via a through hole, and is connected to the signal terminal disposed on the terminal line on the back side in a view from the connector 271a.

As illustrated in FIG. 10, the control IC 101 is mounted on the upper right of the connector 102 on the control circuit board 100. The control IC 101 has a rectangular package outer shape. A plurality of signal terminals is formed on the control IC 101. The plurality of signal terminals is soldered to the control circuit board 100 and is electrically connected to the control circuit board 100. On the control circuit board 100, three pairs of differential transmission wiring are wired as high-speed transmission wiring 105 electrically connected from the connector 102 to part of the signal terminals of the control IC 101. The high-speed transmission wiring 105 is electrically connected to the high-speed transmission wiring wired inside the first flexible printed circuit board 270a, via the connector 273 and the connector 102. The high-speed transmission wiring 105 forms a differential transmission line that is similar to the high-speed transmission wiring wired on the first flexible printed circuit board 270a. Various signal wiring and ground wiring are formed on the control circuit board 100 in addition to the high-speed transmission wiring 105, but they are not illustrated in FIG. 10.

Generally, when a plurality of electrical signals that need to be synchronized is transmitted in a high-speed transmission line, equal-length wiring may be used so that each wiring for transmitting the plurality of electrical signals has equal length and that a difference in delay time due to the wiring is sufficiently small. The signal line may be wired as short as possible and may be designed not to be affected by noise and the like. On the control circuit board 100, the connector 102 and the control IC 101 may be disposed as close as possible so that the path is shorten from the image stabilizing unit 200 to the control IC 101 mounted on the control circuit board 100. The control IC 101 may be disposed on the left side or the right side of the connector 102 of the control circuit board 100, which may make it possible to further shorten the wiring length of the high-speed transmission wiring.

As described above, the high-speed transmission line is wired on the first flexible printed circuit board 270a, and the connector 271a mounted on the first connecting portion 275a and the connector 273 mounted on the second connecting portion 278 are likely to be noise sources. Particularly, since the connector 271a connected to the image sensor circuit board 231 is disposed on a side closer to the built-in wireless antenna 10b (FIG. 1A) of the image pickup apparatus 10, the electromagnetic field noise may propagate and a wireless performance may deteriorate. Thus, in this embodiment, on the first flexible printed circuit board 270a, the radio wave absorber 290 entirely covers the insulation reinforcing material portion on the back surface of the connector 271a, the back surface being the side closer to the wireless antenna 10b. For convenience of attachment, the radio wave absorber 290 has a hole on a side far from the wireless antenna 10b, that is a connector 273 side. Thereby, it is possible to suppress an influence on the wireless antenna 10b more efficiently. As a countermeasure against the electromagnetic field noise for a flexible printed circuit board, a method is also generally known of attaching a shield film such as silver and of providing a shield function.

On the other hand, the high-speed transmission wiring represented by LVDS requires to manage impedance at constant value. As this embodiment, in a configuration in which a countermeasure is not attached to the entire wiring and the distance between the countermeasure and the wiring is not kept constant, the shield film of a conductor may change the impedance. Thus, in this embodiment, the magnetic type radio wave absorber 290, which has little influence on impedance, is suitable.

As described above, this embodiment can reduce the electromagnetic field noise while suppressing an increase in the load applied when the movable unit shifts. Since the first wiring portion 276 and the second wiring portion 277 extend in the directions opposite to each other in the up-down direction, it is possible to make the load balance more uniform, the load being generated when the movable unit 200a shifts. Thereby, it is possible to prevent the driving control of the movable unit 200a from becoming complicated and to suppress the power consumption. Since it is not necessary to design, to be excessively small, an amount of deformation per unit length of the flexible parts of the first flexible printed circuit board 270a and the second flexible printed circuit board 270b, the image pickup apparatus 10 may be easily downsized.

The radio wave absorber 290 entirely covers the insulation reinforcing material portion on the back surface of the connector 271a of the first flexible printed circuit board 270a, which is the side closer to the wireless antenna 10b, of the connecting portions with the circuit board that is likely to generate the electromagnetic field noise. Thereby, it is possible to prevent the wireless performance from deteriorating more efficiently.

In this embodiment, the sizes of the reaction forces may be made substantially equal, the reaction force being generated by the first flexible printed circuit board 270a and the second flexible printed circuit board 270b. The reaction forces may be designed by using not only the lengths and widths of the first wiring portion 276 and the second wiring portion 277, but also a viewpoint on bending rigidity in consideration of a thickness and presence or absence of the radio wave absorber 290. In this embodiment, thicknesses of wiring paths of the first flexible printed circuit board 270a and the second flexible printed circuit board 270b can be individually designed. For example, as long as a cross-sectional area is constant, the second flexible printed circuit board 270b may be configured such that the thickness is increased and the width is narrowed, so that the load is equal to that of the first flexible printed circuit board 270a. Thereby, the width can be changed without changing a rated current value of the second flexible printed circuit board 270b.

This embodiment has a configuration which provides the electromagnetic field noise countermeasure only on the first flexible printed circuit board 270a, but may provide the same countermeasure on the second flexible printed circuit board 270b. That is, a radio wave absorber as a second radio wave absorber similar to the radio wave absorber 290 may be provided on the second flexible printed circuit board 270b. Further, the first flexible printed circuit board 270a, the second flexible printed circuit board 270b and the third flexible printed circuit board 240 may be integrally formed instead of being formed separately.

Second Embodiment

Next, a second embodiment will be described of the present invention with reference to FIGS. 11 to 13C. This embodiment differs from the first embodiment mainly in configurations of a first flexible printed circuit board and a second flexible printed circuit board, and a configuration of a rear yoke. The other configurations of this embodiment are the same as those of the first embodiment. The same components as those of the image pickup apparatus 10 in the first embodiment are designated by the same reference numerals and a description thereof will be omitted.

Figure 11:
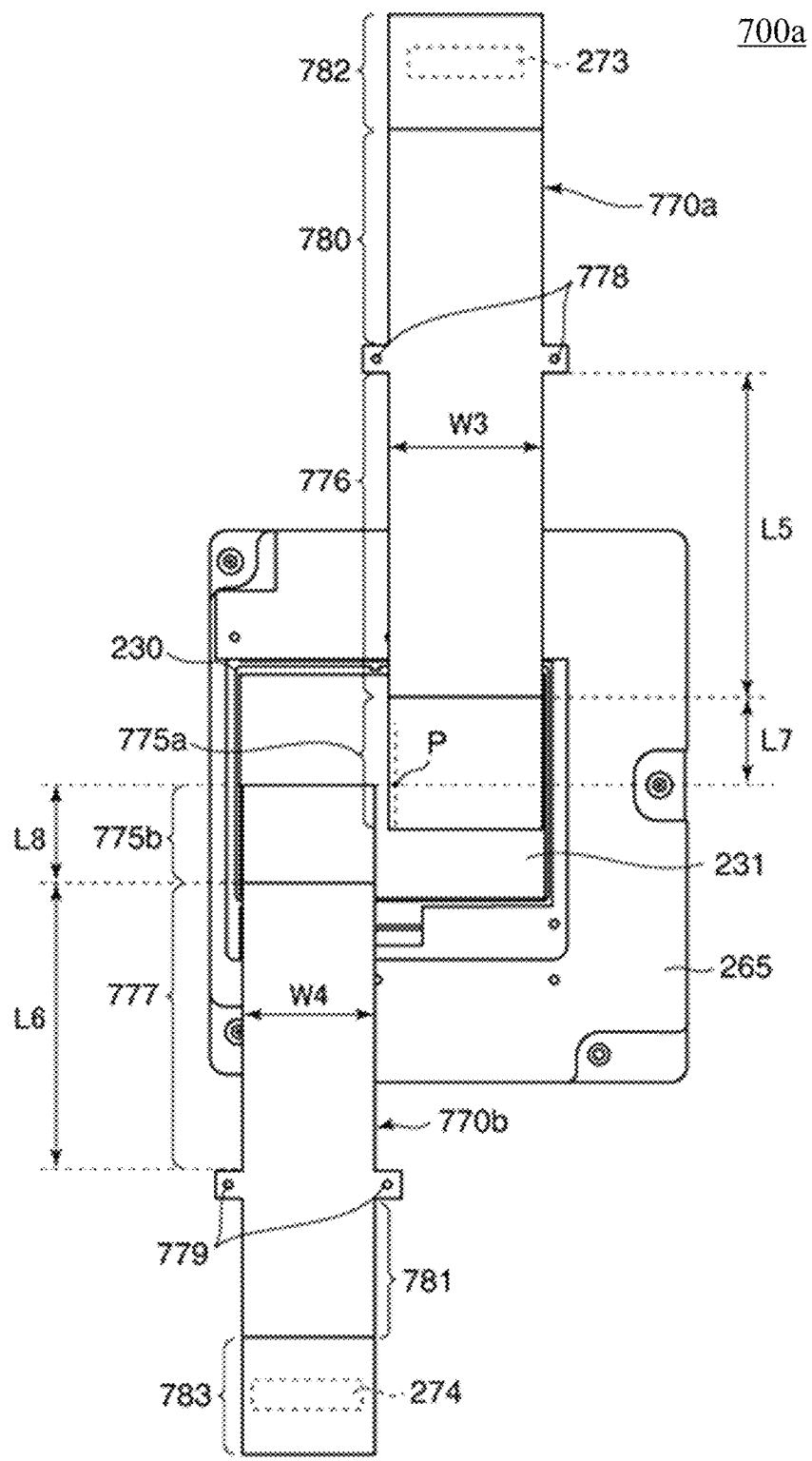
FIG. 11 is a rear view illustrating a movable unit to which a first flexible printed circuit board and a second flexible printed circuit board are fixed according to a second embodiment.
Figure 12:
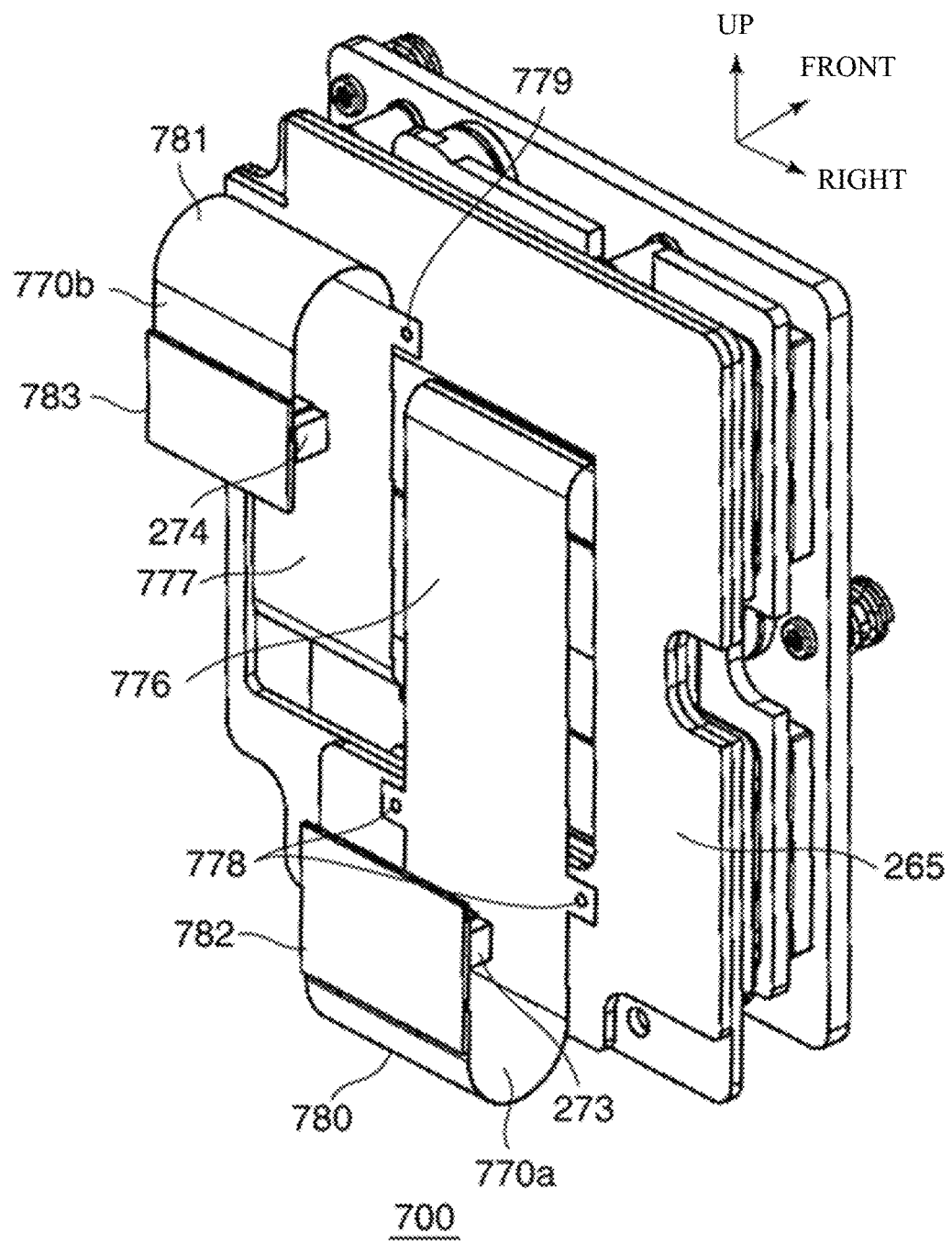
FIG. 12 is a perspective view illustrating an image stabilizing unit according to the second embodiment.

FIG. 11 is a rear view illustrating a movable unit 700a to which a first flexible printed circuit board 770a and a second flexible printed circuit board 770b are fixed. FIG. 12 is a perspective view illustrating an image stabilizing unit 700.

Figure 13A:
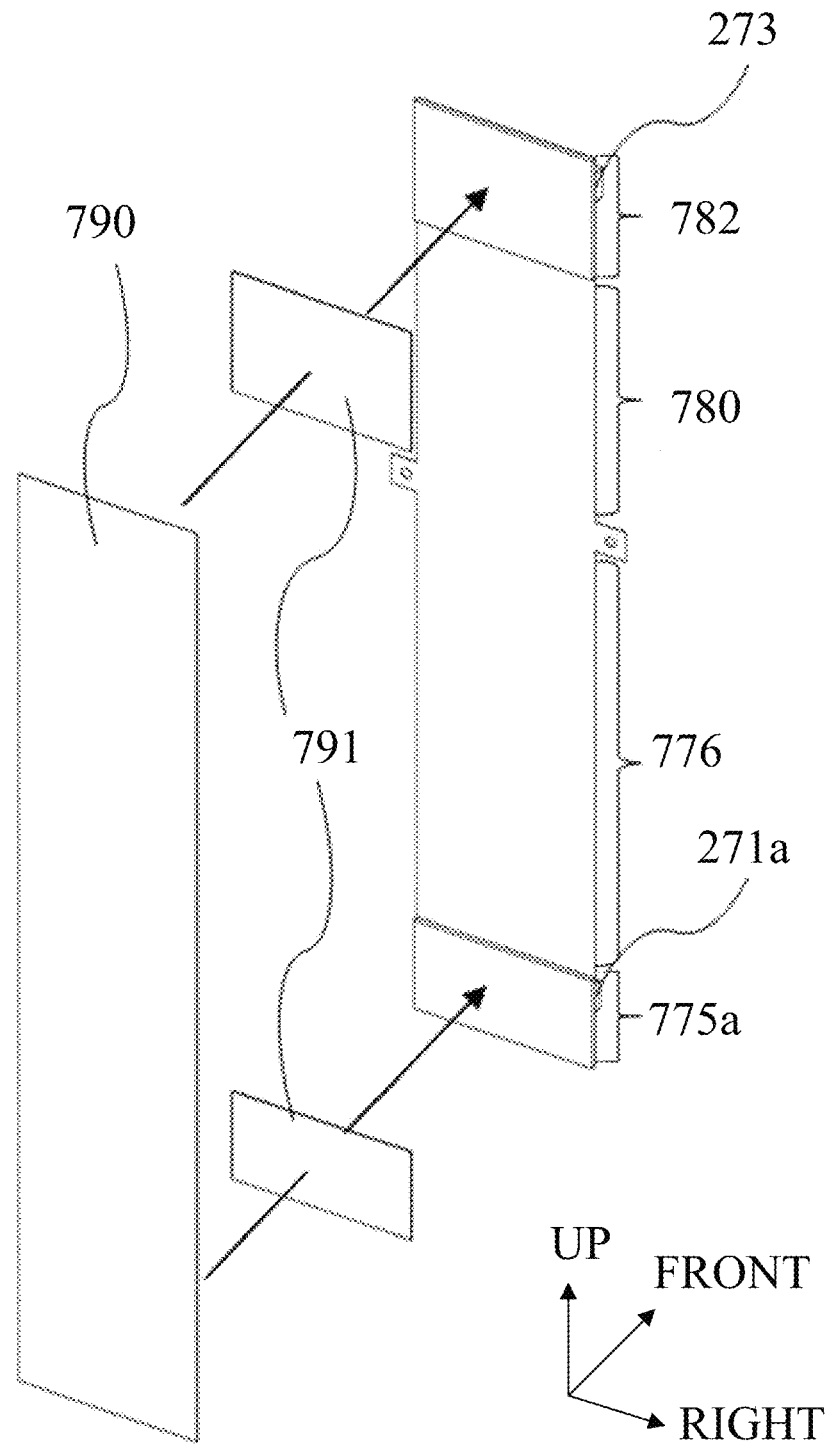
FIG. 13A is an explanatory diagram illustrating a countermeasure against electromagnetic field noise provided on the first flexible printed circuit board according to the second embodiment.
Figure 13B:
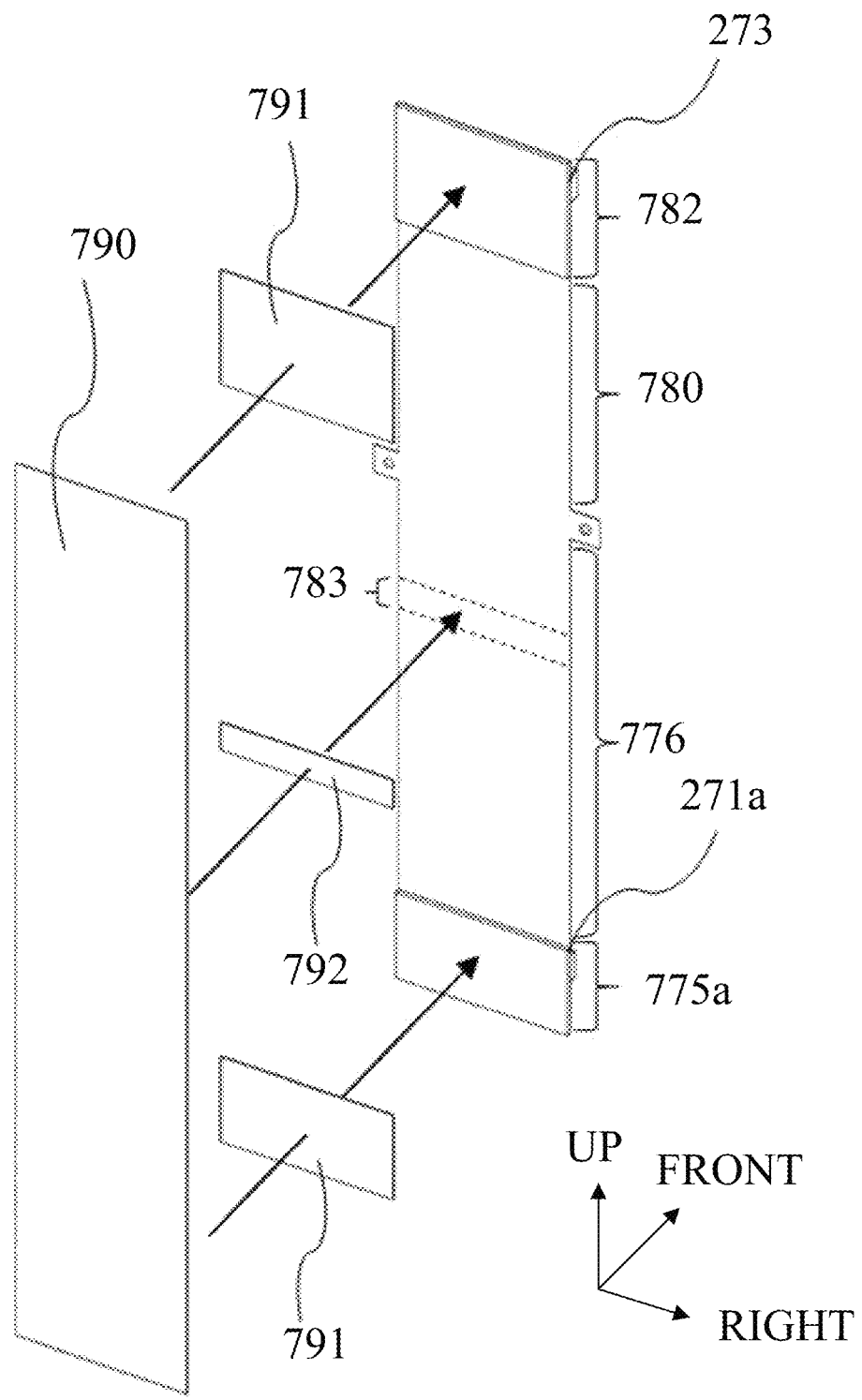
FIG. 13B is an explanatory diagram illustrating the countermeasure against the electromagnetic field noise provided on the first flexible printed circuit board according to the second embodiment.
Figure 13C:
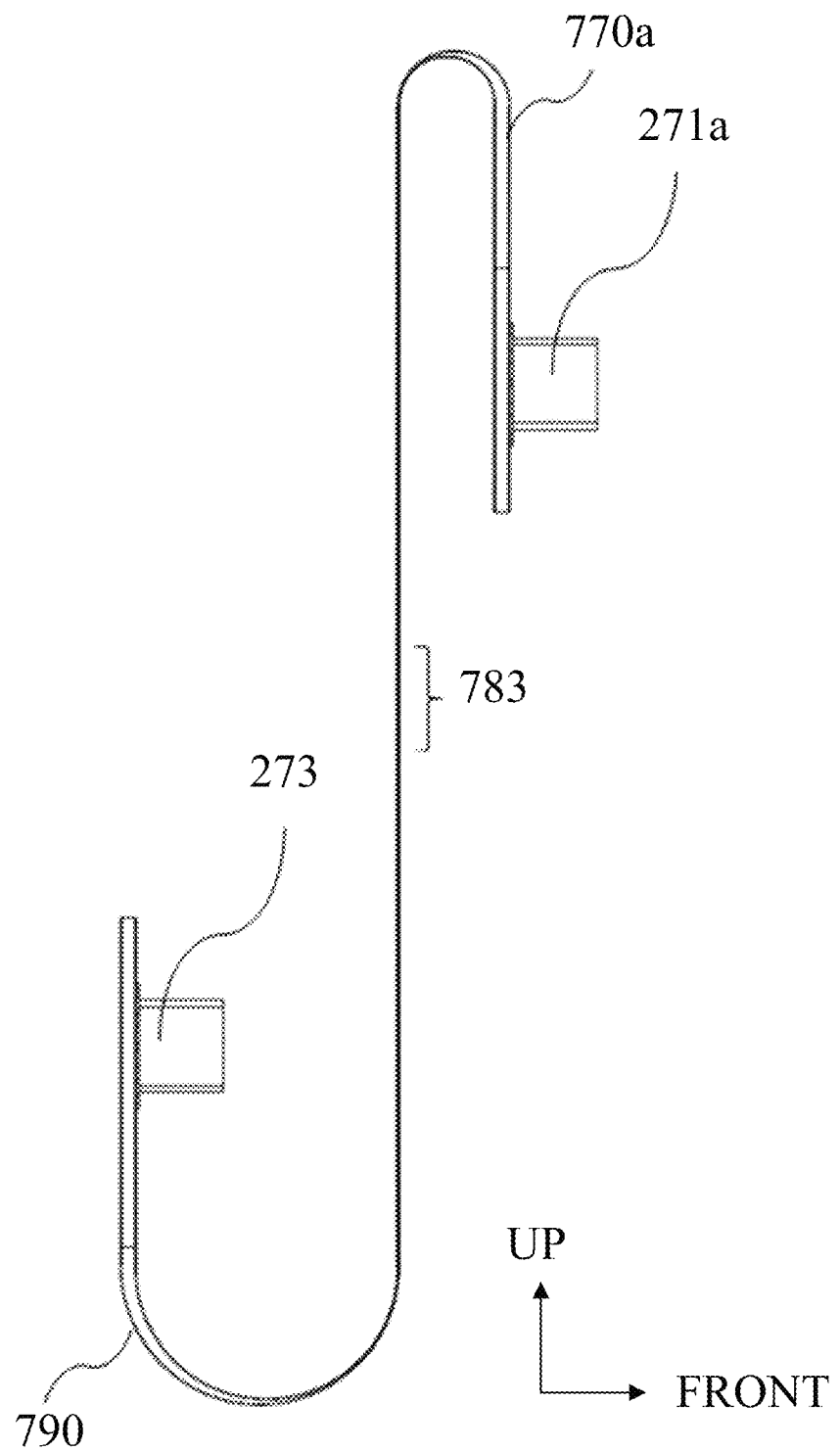
FIG. 13C is an explanatory diagram illustrating the countermeasure against the electromagnetic field noise provided on the first flexible printed circuit board according to the second embodiment.

FIGS. 13A and 13B are exploded perspective views illustrating an attachment position of an electromagnetic field noise countermeasure component, which is applied to the first flexible printed circuit board 770a. FIG. 13C is a side view viewed from the right side illustrating the first flexible printed circuit board 770a to which the electromagnetic field noise countermeasure component is attached and to which the circuit board is connected, where the first flexible printed circuit board 770a is extracted for a simplification of a description.

The image stabilizing unit 700 in this embodiment corresponds to the image stabilizing unit 200 in the first embodiment, and includes the first flexible printed circuit board 770a and the second flexible printed circuit board 770b. The first flexible printed circuit board 770a and the second flexible printed circuit board 770b in this embodiment correspond to the first flexible printed circuit board 270a and the second flexible printed circuit board 270b in the first embodiment, respectively. The image stabilizing unit 700 includes a rear yoke 265 corresponding to the rear yoke 260 in the first embodiment. The rear yoke 265 has a flat plate shape in which an outer shape is formed in a U shape in a view from an optical axis P direction.

The first flexible printed circuit board 770a includes a first connecting portion 775a, a wiring portion 776, a wiring portion 780 and a second connecting portion 782 in order from the side closer to the connector 271a illustrated in FIG. 3 in a wiring direction, that is a longitudinal direction. The connector 271a is disposed on the first connecting portion 775a, and the connector 273 is disposed on the second connecting portion 782. In a comparison with the first flexible printed circuit board 270a, the first connecting portion 775a corresponds to the first connecting portion 275a, the wiring portion 776 and the wiring portion 780 correspond to the first wiring portion 276, and the second connecting portion 782 corresponds to the second connecting portion 278.

The second flexible printed circuit board 770b includes a third connecting portion 775b, a wiring portion 777, a wiring portion 781 and a fourth connecting portion 783 in order from the side closer to the connector 271b illustrated in FIG. 3 in the wiring direction, that is the longitudinal direction. The third connecting portion 775b corresponds to the third connecting portion 275b, the wiring portion 777 and the wiring portion 781 correspond to the second wiring portion 277, and the fourth connecting portion 783 corresponds to the fourth connecting portion 279.

On the first flexible printed circuit board 770a, the wiring portion 776 extends from the first connecting portion 775a in an upward direction orthogonal to the optical axis P, that is also referred to as a predetermined axis line. On the second flexible printed circuit board 770b, the wiring portion 777 extends from the third connecting portion 775b in a downward direction orthogonal to the optical axis P, the downward direction being opposite direction of the upward direction. On the first flexible printed circuit board 770a, a wiring path is formed which is electrically connected from the connector 271a mounted on the first connecting portion 775a to the connector 273 mounted on the second connecting portion 782 via the wiring portions 776 and 780. On the second flexible printed circuit board 770b, a wiring path is formed which is electrically connected from the connector 271b mounted on the third connecting portion 775b to the connector 274 mounted on the fourth connecting portion 783 via the wiring portions 777 and 781. Here, since each of the first flexible printed circuit board 770a and the second flexible printed circuit board 770b has the connectors on a same mounting surface, each of them can be manufactured with a single-sided wiring structure, and thus this embodiment uses the single-sided wiring structure that may easily achieve a qualitatively soft structure.

In the wiring direction of the first flexible printed circuit board 770a, a first fixed portion 778 is formed at an intermediate position of a wiring portion between the first connecting portion 775a and the second connecting portion 782. That is, the first fixed portion 778 is provided between the wiring portion 776 and the wiring portion 780 and is fixed to the rear yoke 265.

On the other hand, in the wiring direction of the second flexible printed circuit board 770b, a second fixed portion 779 is formed at an intermediate position of a wiring portion between the third connecting portion 775b and the fourth connecting portion 783. That is, the second fixed portion 779 is provided between the wiring portion 777 and the wiring portion 781 and is fixed to the rear yoke 265.

Each of the first fixed portion 778 and the second fixed portion 779 is formed with a hole for adjusting each of their positions to the rear yoke 265. The operator adjusts the positions of the fixed portions 778 and 779 to corresponding holes of the rear yoke 265 using a jig or the like, and then fixes the rear yoke 265. Since the fixed portions 778 and 779 are fixed to the rear yoke 265, the positions of the fixed portions 778 and 779 and areas do not shift, the areas being on the second connecting portion 782 side and on the fourth connecting portion 783 side.

The first fixed portion 778 is fixed to the rear yoke 265 in a state where a certain amount of flexure is formed of the wiring portion 776 so that the wiring portion 776 maintains a flexural shape. Similarly, the second fixed portion 779 is connected to the rear yoke 265 in a state where a certain amount of flexure is formed of the wiring portion 777 so that the wiring portion 777 maintains a flexural shape. An amount of flexure formed in each of the wiring portions 776 and 777 is set so that when the movable unit 700a shifts to a position farthest from the optical axis P, each the wiring portions 776 and 777 does not fully extend and maintains a predetermined amount of flexure.

In a left-right direction, the wiring portions 776 and 777 are separated from each other by equal to or more than a maximum movable amount of a translational movement of the movable unit 700a in the left-right direction. This prevents the wiring portions 776 and 777 from interfering with each other and from affecting the load during an image stabilization.

As described above, the wiring portion 776 and the wiring portion 777 are separated and pulled out in two routes of upper and lower in the translational direction of the movable unit 700a, that is, in directions opposite to each other. Similarly to the first embodiment, the loads can be made more uniformly between when the movable unit 700a is driven in the rightward direction and in the leftward direction, the load being generated by the deformation of each of the first flexible printed circuit board 770a and the second flexible printed circuit board 770b. Further, the loads can be made uniformly between when the movable unit 700a is driven in the upward direction and in the downward direction, the load generated by the deformation of each of the first flexible printed circuit board 770a and the second flexible printed circuit board 770b.

Here, with reference to FIG. 13A to FIG. 13C, a detailed expression will be given of a configuration relating to a countermeasure against electromagnetic field noise applied to the first flexible printed circuit board 770a. A high-speed transmission line is wired on the first flexible printed circuit board 770a. In the high-speed transmission line, high-speed transmission wiring may generate the electromagnetic field noise, and mainly, the connecting portion between the circuit boards is likely to be a noise source. That is, the connector 271a mounted on the first connecting portion 775a and the connector 273 mounted on the third connecting portion 775b are likely to be the noise sources.

FIGS. 13A and 13B are exploded perspective views illustrating the attachment position of the electromagnetic field noise countermeasure component, which is applied to the first flexible printed circuit board 770a. FIG. 13C is a side view viewed from the right side illustrating the first flexible printed circuit board 770a to which the electromagnetic field noise countermeasure component is attached and to which the circuit board is connected, where the first flexible printed circuit board 770a is extracted for a simplification of a description. FIG. 13A illustrates the simplest method of attaching the electromagnetic field noise countermeasure component in this embodiment, and FIG. 13B illustrates another example of a derivative method of attaching the electromagnetic field noise countermeasure component.

A radio wave absorber 790 is a thin sheet-shaped member of about 100 μm thick having a magnetic layer containing powder of magnetic material such as sendust or ferrite in this embodiment. However, the present invention is not limited to this, and may use other dielectric or non-conductor. A double-sided tape 791 is, for example, an acrylic double-sided tape. In FIG. 13A, the double-sided tape 791 is disposed on an insulation reinforcing material portion on the back surface of the connector 271a and the insulation reinforcing material portion on the back surface of the connector 273, and the double-sided tape 791 makes the radio wave absorber 790 partially attached to the first flexible printed circuit board 770a. That is, the radio wave absorber 790 is attached to a rigid part of the first flexible printed circuit board 770a, but the radio wave absorber 790 is not attached to the wiring portions 780 and 776 as flexible parts of the first flexible printed circuit board 770a The radio wave absorber 790 bends following the first flexible printed circuit board 770a in a circuit board connected state as illustrated in FIG. 13C, and the double-sided tape 791 does not exist in the wiring portions 780 and 776 as flexible parts.

In general, it is known that presence of an adhesive layer enhances a repulsive force in a bending portion. In a pasting method illustrated in FIG. 13A, the adhesive layer, that is the double-sided tape 791, is not disposed on the flexible part so that it is possible to suppress an increase in the load caused by the deformation of the flexible printed circuit board when the movable unit 700a shifts.

On the other hand, in FIG. 13B, an acrylic double-sided tape 792 is also disposed on the wiring portion 776 of the first flexible printed circuit board 770a, and the radio wave absorber 790 is partially attached to the first flexible printed circuit board 770a. However, as illustrated in FIGS. 13B and 13C, an attachment position (fourth connecting portion 783) of the double-sided tape 792 is made to a minimum attachment area while a portion where the wiring portion 776 bends is avoided. This makes it possible to suppress the increase in the load caused by the deformation of the flexible printed circuit board when the movable unit 700a shifts.

In this embodiment, as illustrated in FIG. 13B and FIG. 13C, the double-sided tape 792 is attached to a substantially central portion of a straight part of the first flexible printed circuit board 770a while the part where the wiring portion 776 bends is avoided. However, this embodiment is not limited to such a structure as long as the double-sided tape does not cover the bending portion.

The configuration of FIG. 13B has higher followability of the radio wave absorber 790 to the first flexible printed circuit board 770a than that of the configuration of FIG. 13A. Thereby, in the configuration of FIG. 13B, it is easier to acquire a more stable electromagnetic field noise countermeasure effect. If the countermeasure against the electromagnetic field noise is sufficient, the simple configuration of FIG. 13A may be used.

In this embodiment, the radio wave absorber 790 is attached to the first flexible printed circuit board on the insulation reinforcing material side that is opposite side of a side where the two connectors 271a and 273 are attached. If the radio wave absorber 790 is attached to a side different from this embodiment, the radio wave absorber 790 has a configuration with a hole for a convenience of the attachment. According to the configuration in this embodiment, the radio wave absorber 790 covers an entire surface of a connector projection surface (entire projection area), and thus the effect can be further enhanced of preventing the electromagnetic field noise.

As illustrated in FIG. 11, L5 represents a length from a boundary between the first connecting portion 775a and the wiring portion 776 to the first fixed portion 778. L6 represents a length from a boundary between the third connecting portion 775b and the wiring portion 777 to the second fixed portion 779. L7 represents a length from the optical axis P to the boundary between the first connecting portion 775a and the wiring portion 776. L8 represents a length from the optical axis P to the boundary between the third connecting portion 775b and the wiring portion 777. W3 represents a width of the wiring portion 776 in the left-right direction, and W4 represents a width of the wiring portion 777 in the left-right direction.

Basically, in order to make a load balance more uniform, the load being caused by the deformation of each of the flexible printed circuit boards 770a and 770b, the length L5 and the length L6 may be made substantially the same length, and the length L7 and the length L8 may be made substantially the same length. The width W3 and the width W4 may be made substantially the same width.

On the other hand, a layer configuration and a wiring width may vary the load generated by the deformation of each flexible printed circuit board, and the length L and the width W are adjusted so that a load variation is cancelled. Thereby, the load can be made more uniform, the load being caused by the deformation of each of the first flexible printed circuit board 770a and the second flexible printed circuit board 770b, and it is possible to contribute to downsize the image pickup apparatus 10 and to reduce power consumption.

This embodiment has a configuration which provides the electromagnetic field noise countermeasure only on the first flexible printed circuit board 770a, but the same countermeasure may be provided on the second flexible printed circuit board 770b.

As described above, this embodiment can reduce the electromagnetic field noise while suppressing the increase in the load applied when the movable unit shifts. In particular, the radio wave absorber 790 covers the entire surface of the projection surface of the connecting portion of the connector and the circuit board, which is likely to be a source of electromagnetic field noise, and thus the electromagnetic field noise can be effectively suppressed.

Further, the wiring portion 776 and the wiring portion 777 extend in the directions opposite to each other in the up-down direction. Thereby, this embodiment can acquire an effect similar to that of the first embodiment regarding making the load balance more uniform when the movable unit 700a shifts.

In this embodiment, the wiring portions 776 and 777 mainly flex, and the areas on the second connecting portion 782 side and on the fourth connecting portion 783 side of the fixed portions 778 and 779 hardly flex. Thus, it is not necessary to largely form the notches 107a and 107b of the control circuit board 100 with a margin in consideration of a maximum shift amount of the movable unit 700a. Thereby, a circuit board area of the control circuit board 100 can be expanded. In addition, the wiring portion 780 may be easily formed in a suitable shape while equal length wiring is used of the high-speed transmission lines wired inside the first flexible printed circuit board 770a. Accordingly, it is possible to improve a degree of freedom of a component disposition and of wiring on the control circuit board 100, while a transmission quality of the high-speed transmission line is ensured.

The first fixed portion 778 and the second fixed portion 779 may not be directly fixed to the rear yoke 265 but may be fixed via a separate holding member or the like. In that case, the holding member may have a cylindrical positioning shape, and the positioning shape may be fitted to the holes formed on the fixed portions 778 and 779. The load generated by the deformation may be reduced by, for example, forming slits on the wiring portions 776 and 777 in a direction parallel to the wiring paths. Thereby, the image stabilizing unit 700 may be controlled with high accuracy.

Each embodiment is not limited to the image pickup apparatus such as a camera, and may also be used in various electronic apparatuses in which a flexible printed circuit board connects a movable unit movably supported by a supporting unit and a control circuit board. When each embodiment is applied to the image pickup apparatus, the image pickup apparatus may have a configuration in which a camera body and a lens are integrated with each other, or a configuration in which the lens is detachably attachable to the camera body.

As described above, an electronic apparatus (image pickup apparatus 10) of each embodiment includes a supporting member (fixing unit 200b), a movable member (movable unit 200a), a controller (control circuit board 100), a first flexible printed circuit board 270a, and a first radio wave absorber (radio wave absorber 290). The supporting member is configured to support the movable member movably with respect to the supporting member. The controller is configured to control a shift of the movable member. The first flexible printed circuit board is configured to electrically connect the movable member and the controller. The first radio wave absorber is a sheet-shaped member that overlays the first flexible printed circuit board and is partially fixed to the first flexible printed circuit board.

The first flexible printed circuit board may include a first connecting portion 275a connected to a movable member, a first wiring portion 276 extending from the first connecting portion, and a second connecting portion 278 disposed at an end portion of the first wiring portion and connected to the controller. The first radio wave absorber is partially attached near each of the first connecting portion and the second connecting portion. The supporting member may support the movable member movably in a direction orthogonal to a predetermined axis (optical axis P) with respect to the supporting member.

Each embodiment can provide an electronic apparatus that can reduce an electromagnetic field noise while suppressing an increase in a load when the movable unit shifts.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-214014, filed on Nov. 27, 2019 which is hereby incorporated by reference herein in its entirety.

What is claimed is:

1. An electronic apparatus comprising:
a supporting member;
a movable member supported by the supporting member movably with respect to the supporting member;
a controller configured to control a movement of the movable member;
a first flexible printed circuit board configured to electrically connect the movable member and the controller; and
a first radio wave absorber having a sheet shape that overlays the first flexible printed circuit board and that is partially fixed to the first flexible printed circuit board,
wherein the first flexible printed circuit board includes:
a first connecting portion connected to the movable member;
a first wiring portion extending from the first connecting portion; and
a second connecting portion disposed at an end portion of the first wiring portion and connected to the controller, and
wherein the first radio wave absorber is partially attached near each of the first connecting portion and the second connecting portion.

2. The electronic apparatus according to claim 1, wherein the supporting member supports the movable member movably in a direction orthogonal to a predetermined axis with respect to the supporting member.

3. The electronic apparatus according to claim 2,
wherein the first wiring portion extends from the first connecting portion in a first direction that is orthogonal to the predetermined axis.

4. The electronic apparatus according to claim 2,
wherein the first radio wave absorber is partially attached to the first wiring portion while a bending portion is avoided.

5. The electronic apparatus according to claim 2,
wherein the first radio wave absorber is attached to the first flexible printed circuit board so that an entire projection area of a connector is covered, the connector being disposed on at least one of the first connecting portion and the second connecting portion of the first flexible printed circuit board.

6. The electronic apparatus according to claim 2, further comprising
a second flexible printed circuit board configured to electrically connect the movable member and the controller,
wherein the second flexible printed circuit board includes:
a third connecting portion connected to the movable member;
a second wiring portion extending from the third connecting portion in a second direction that is orthogonal to the predetermined axis and that is opposite to a first direction; and
a fourth connecting portion disposed on an end portion of the second wiring portion and connected to the controller.

7. The electronic apparatus according to claim 6, further comprising
a second radio wave absorber having a sheet shape that overlays the second flexible printed circuit board and that is partially fixed to the second flexible printed circuit board,
wherein the radio wave absorber is partially attached near each of the third connecting portion and the fourth connecting portion.

8. The electronic apparatus according to claim 7,
wherein the second radio wave absorber is partially attached to the second wiring portion while a bending portion is avoided.

9. The electronic apparatus according to claim 8,
wherein the first radio wave absorber is attached to the first flexible printed circuit board so that an entire projection area of a connector is covered, the connector being disposed on at least one connecting portion on a side closer to a wireless antenna among the first connecting portion and the second connecting portion.

10. The electronic apparatus according to claim 6,
wherein the second radio wave absorber is attached to the second flexible printed circuit board so that an entire projection area of a connector is covered, the connector being disposed on at least one of the third connecting portion and the fourth connecting portion on the second flexible printed circuit board.

11. The electronic apparatus according to claim 10,
wherein the second radio wave absorber is attached to the second flexible printed circuit board so that the entire projection area of a connector is covered, the connector being disposed on at least one connecting portion on a side closer to a wireless antenna among the third connecting portion and the fourth connecting portion.

12. The electronic apparatus according to claim 6,
wherein at least one of an intermediate position in a wiring direction of the first wiring portion of the first flexible printed circuit board and an intermediate position in a wiring direction of the second wiring portion of the second flexible printed circuit board is fixed to the supporting member or to a member fixed to the supporting member.

13. The electronic apparatus according to claim 5,
wherein the first flexible printed circuit board includes a differential transmission wiring.

14. The electronic apparatus according to claim 6,
wherein the second flexible printed circuit board includes a power wiring.

15. The electronic apparatus according to claim 6,
wherein lengths and widths are respectively equal between the first wiring portion of the first flexible printed circuit board and the second wiring portion of the second flexible printed circuit board.

16. The electronic apparatus according to claim 12,
wherein widths and lengths are respectively equal between a range from the first connecting portion to the intermediate position in the wiring direction of the first flexible printed circuit board and a range from the third connecting portion to the intermediate position in the wiring direction of the second flexible printed circuit board.

17. The electronic apparatus according to claim 1,
wherein the electronic apparatus is an image pickup apparatus,
wherein the movable member is a member configured to hold an image sensor that converts an optical image of an object into an electric signal, and
wherein the supporting member supports the movable member movably in a direction orthogonal to an optical axis direction with respect to the supporting member.

18. The electronic apparatus according to claim 17,
wherein the controller optically corrects an object blur by moving the movable member in a direction orthogonal to the optical axis with respect to the supporting member.

19. An electronic apparatus comprising:
a supporting member;
a movable member supported by the supporting member movably with respect to the supporting member;
a controller configured to control a movement of the movable member;
a first flexible printed circuit board configured to electrically connect the movable member and the controller; and
a first radio wave absorber having a sheet shape that overlays the first flexible printed circuit board and that is partially fixed to the first flexible printed circuit board,
wherein the first flexible printed circuit board includes:
a first connecting portion connected to the movable member;
a first wiring portion extending from the first connecting portion; and
a second connecting portion disposed at an end portion of the first wiring portion and connected to the controller, and
wherein the first radio wave absorber is partially attached to the first wiring portion while a bending portion is avoided.

20. The electronic apparatus according to claim 19,
wherein the electronic apparatus is an image pickup apparatus,
wherein the movable member is a member configured to hold an image sensor that converts an optical image of an object into an electric signal, and
wherein the supporting member supports the movable member movably in a direction orthogonal to an optical axis direction with respect to the supporting member.

21. The electronic apparatus according to claim 20,
wherein the controller optically corrects an object blur by moving the movable member in a direction orthogonal to the optical axis with respect to the supporting member.

* * * * *